US011555128B2

United States Patent
Pan et al.

(10) Patent No.: US 11,555,128 B2
(45) Date of Patent: Jan. 17, 2023

(54) PRINTING COMPOSITION, ELECTRONIC DEVICE COMPRISING SAME AND PREPARATION METHOD FOR FUNCTIONAL MATERIAL THIN FILM

(71) Applicant: GUANGZHOU CHINARAY OPTOELECTRONIC MATERIALS LTD., Guangzhou (CN)

(72) Inventors: Junyou Pan, Guangzhou (CN); Xi Yang, Guangzhou (CN); Xiaolin Yan, Guangzhou (CN)

(73) Assignee: GUANGZHOU CHINARAY OPTOELECTRONIC MATERIALS LTD., Guangzhou (CN)

( * ) Notice: Subject to any disclaimer, the term of this patent is extended or adjusted under 35 U.S.C. 154(b) by 1284 days.

(21) Appl. No.: 15/775,395

(22) PCT Filed: Sep. 26, 2016

(86) PCT No.: PCT/CN2016/100164
§ 371 (c)(1),
(2) Date: May 11, 2018

(87) PCT Pub. No.: WO2017/080326
PCT Pub. Date: May 18, 2017

(65) Prior Publication Data
US 2020/0291251 A1 Sep. 17, 2020

(30) Foreign Application Priority Data
Nov. 12, 2015 (CN) .......................... 201510769470.9

(51) Int. Cl.
*C09D 11/033* (2014.01)
*H01L 51/00* (2006.01)
(Continued)

(52) U.S. Cl.
CPC .......... *C09D 11/033* (2013.01); *C09D 11/037* (2013.01); *C09D 11/322* (2013.01);
(Continued)

(58) Field of Classification Search
None
See application file for complete search history.

(56) References Cited

U.S. PATENT DOCUMENTS 3,567,450 A 3/1971 Brantly et al.
3,615,404 A 10/1971 Price et al.
(Continued)

FOREIGN PATENT DOCUMENTS

CN 1180049 C 11/2002
CN 1583691 A 2/2005
(Continued)

OTHER PUBLICATIONS

First Office Action of Chinese Patent Application No. 201680059877.5 dated Jul. 29, 2020.
(Continued)

*Primary Examiner* — Katie L. Hammer
(74) *Attorney, Agent, or Firm* — PV IP PC; Wei Te Chung; Ude Lu

(57) ABSTRACT

A printing formulation, an electronic device comprising a function layer prepared from the printing formulation and a preparation method for obtaining a functional material thin film by utilizing the printing formulation. The printing formulation comprises at least one functional material and at least one inorganic ester solvent, and the inorganic ester solvent can be selected from alkyl borate or alkyl phosphate.

14 Claims, 1 Drawing Sheet

(51) Int. Cl.
*H01L 51/50* (2006.01)
*C09D 11/36* (2014.01)
*C09D 11/38* (2014.01)
*C09D 11/037* (2014.01)
*C09D 11/322* (2014.01)
*H01L 51/42* (2006.01)

(52) U.S. Cl.
CPC .............. *C09D 11/36* (2013.01); *C09D 11/38* (2013.01); *H01L 51/0007* (2013.01); *H01L 51/0022* (2013.01); *H01L 51/502* (2013.01); *H01L 51/5012* (2013.01); *H01L 51/5016* (2013.01); *H01L 51/4273* (2013.01); *H01L 51/5056* (2013.01); *H01L 51/5072* (2013.01); *H01L 51/5092* (2013.01); *Y02E 10/549* (2013.01)

(56) References Cited

U.S. PATENT DOCUMENTS

| | | |
|---|---|---|
| 4,720,432 A | 1/1988 | VanSlyke et al. |
| 4,769,292 A | 9/1988 | Tang et al. |
| 5,061,569 A | 10/1991 | VanSlyke et al. |
| 5,121,029 A | 6/1992 | Hosokawa et al. |
| 5,130,603 A | 7/1992 | Tokailin et al. |
| 5,962,631 A | 10/1999 | Woo et al. |
| 6,020,078 A | 2/2000 | Chen et al. |
| 6,207,229 B1 | 3/2001 | Bawendi et al. |
| 6,251,303 B1 | 6/2001 | Bawendi et al. |
| 6,251,531 B1 | 6/2001 | Enokida et al. |
| 6,319,426 B1 | 11/2001 | Bawendi et al. |
| 6,426,513 B1 | 7/2002 | Bawendi et al. |
| 6,576,291 B2 | 6/2003 | Bawendi et al. |
| 6,607,829 B1 | 8/2003 | Bawendi et al. |
| 6,824,895 B1 | 11/2004 | Sowinski et al. |
| 6,830,828 B2 | 12/2004 | Thompson et al. |
| 6,835,469 B2 | 12/2004 | Kwong et al. |
| 6,861,155 B2 | 3/2005 | Bawendi et al. |
| 6,921,496 B2 | 7/2005 | Anderson et al. |
| 7,029,766 B2 | 4/2006 | Huo et al. |
| 7,060,243 B2 | 6/2006 | Bawendi et al. |
| 7,125,605 B2 | 10/2006 | Bawendi et al. |
| 7,138,098 B2 | 11/2006 | Bawendi et al. |
| 7,150,910 B2 | 12/2006 | Eisler et al. |
| 7,250,226 B2 | 7/2007 | Tokito et al. |
| 7,250,532 B2 | 7/2007 | Iwakuma et al. |
| 7,470,379 B2 | 12/2008 | Anderson et al. |
| 7,566,476 B2 | 7/2009 | Bawendi et al. |
| 8,765,014 B2 | 7/2014 | Cho et al. |
| 2001/0053462 A1 | 12/2001 | Mishima |
| 2004/0002576 A1 | 1/2004 | Oguma et al. |
| 2004/0076853 A1 | 4/2004 | Jarikov |
| 2005/0258742 A1 | 11/2005 | Tsai et al. |
| 2006/0145163 A1* | 7/2006 | Tsujimura .............. H05B 33/14 257/40 |
| 2006/0210830 A1 | 9/2006 | Funahashi et al. |
| 2006/0222886 A1 | 10/2006 | Kwong et al. |
| 2007/0009275 A1 | 4/2007 | Yokoyama |
| 2007/0087219 A1 | 4/2007 | Ren et al. |
| 2007/0208567 A1 | 9/2007 | Amento et al. |
| 2007/0225402 A1 | 9/2007 | Choi et al. |
| 2007/0252517 A1 | 11/2007 | Owczarczyk et al. |
| 2008/0027220 A1 | 1/2008 | Stossel et al. |
| 2008/0113101 A1 | 5/2008 | Inoue et al. |
| 2008/0169753 A1 | 7/2008 | Skipor et al. |
| 2008/0188063 A1 | 8/2008 | Alivisatos et al. |
| 2008/0277626 A1* | 11/2008 | Yang ....................... C09D 11/50 252/301.36 |
| 2009/0053522 A1 | 2/2009 | Sekiguchi et al. |
| 2009/0130296 A1 | 5/2009 | Kwong et al. |
| 2009/0134784 A1 | 5/2009 | Lin et al. |
| 2010/0213448 A1* | 8/2010 | Kato ...................... H01L 51/0012 117/54 |
| 2010/0264371 A1* | 10/2010 | Nick ........................ C09D 7/69 252/301.36 |
| 2010/0265307 A1 | 10/2010 | Linton et al. |
| 2011/0217211 A1 | 9/2011 | Park et al. |
| 2012/0205637 A1 | 8/2012 | Cheon et al. |
| 2012/0217869 A1 | 8/2012 | Adachi et al. |
| 2014/0097406 A1 | 4/2014 | Cheon et al. |
| 2015/0044802 A1 | 2/2015 | Tregub et al. |
| 2015/0075397 A1 | 3/2015 | Gresty et al. |
| 2015/0079720 A1 | 3/2015 | Liu et al. |
| 2015/0101665 A1 | 4/2015 | Liu et al. |
| 2015/0108405 A1 | 4/2015 | Peng et al. |
| 2018/0230321 A1 | 8/2018 | Pan et al. |
| 2018/0237691 A1 | 8/2018 | Pan et al. |

FOREIGN PATENT DOCUMENTS

| | | |
|---|---|---|
| CN | 1682573 A | 10/2005 |
| CN | 101796621 A | 8/2010 |
| CN | 102282150 A | 12/2011 |
| CN | 102408776 A | 4/2012 |
| CN | 102916097 A | 2/2013 |
| CN | 103173060 A | 6/2013 |
| CN | 103483332 A | 1/2014 |
| CN | 101878535 B | 3/2014 |
| CN | 102124588 B | 3/2014 |
| CN | 103824959 A | 5/2014 |
| CN | 103958623 A | 7/2014 |
| CN | 105038408 A | 11/2015 |
| CN | 105062193 A | 11/2015 |
| DE | 102004020298 A1 | 11/2005 |
| DE | 102005058557 A1 | 6/2007 |
| DE | 102009023156 A1 | 12/2010 |
| DE | 102009023154 A1 | 6/2011 |
| EP | 1344788 A1 | 9/2003 |
| EP | 1345477 A2 | 9/2003 |
| EP | 1191613 B1 | 3/2006 |
| EP | 1957606 A1 | 8/2008 |
| EP | 1191614 B1 | 5/2009 |
| EP | 1191612 B1 | 9/2009 |
| JP | 2913116 B2 | 6/1999 |
| JP | 2003338375 A | 11/2003 |
| JP | 2005108556 A | 4/2005 |
| JP | 2005285661 A | 10/2005 |
| JP | 2007211243 A | 2/2007 |
| JP | 2007059939 A | 3/2007 |
| JP | 2007197574 A | 8/2007 |
| JP | 2008053397 A | 3/2008 |
| KR | 20050121443 A | 12/2005 |
| KR | 20110100965 A | 9/2011 |
| TW | 201309696 A | 3/2013 |
| TW | 201309778 A | 3/2013 |
| TW | 201340370 A | 10/2013 |
| TW | 201343874 A | 11/2013 |
| TW | 201350558 A | 12/2013 |
| WO | 200070655 A2 | 11/2000 |
| WO | 2001021729 A1 | 3/2001 |
| WO | 200141512 A1 | 6/2001 |
| WO | 200202714 A2 | 1/2002 |
| WO | 200215645 A1 | 2/2002 |
| WO | 2003020790 A2 | 3/2003 |
| WO | 2003051092 A1 | 6/2003 |
| WO | 03097904 A1 | 11/2003 |
| WO | 2003099901 A1 | 12/2003 |
| WO | 2004041901 A1 | 5/2004 |
| WO | 2004113412 A2 | 12/2004 |
| WO | 2005019373 A2 | 3/2005 |
| WO | 2005033174 A1 | 4/2005 |
| WO | 2005033244 A1 | 4/2005 |
| WO | 2005056633 A1 | 6/2005 |
| WO | 2005104264 A1 | 11/2005 |
| WO | 2006000388 A1 | 1/2006 |
| WO | 2006000389 A1 | 1/2006 |
| WO | 2006052457 A2 | 5/2006 |
| WO | 2006062226 A1 | 6/2006 |
| WO | 2006114364 A1 | 11/2006 |
| WO | 2006118345 A1 | 11/2006 |
| WO | 2006122630 A2 | 11/2006 |
| WO | 2006134599 A1 | 12/2006 |
| WO | 2007043495 A1 | 4/2007 |
| WO | 2006058737 A1 | 6/2007 |

(56) References Cited

FOREIGN PATENT DOCUMENTS

| | | |
|---|---|---|
| WO | 2007065549 A1 | 8/2007 |
| WO | 2007092606 A2 | 8/2007 |
| WO | 2007095118 A2 | 8/2007 |
| WO | 2007115610 A1 | 10/2007 |
| WO | 2007117672 A2 | 10/2007 |
| WO | 2007117698 A2 | 10/2007 |
| WO | 2007120877 A2 | 10/2007 |
| WO | 2007140847 A1 | 12/2007 |
| WO | 2007143197 A2 | 12/2007 |
| WO | 2008006449 A1 | 1/2008 |
| WO | 2008033388 A2 | 3/2008 |
| WO | 2008063652 A1 | 5/2008 |
| WO | 2008063653 A1 | 5/2008 |
| WO | 2008070028 A2 | 6/2008 |
| WO | 2008085210 A2 | 7/2008 |
| WO | 2008105792 A2 | 9/2008 |
| WO | 2008108798 A2 | 9/2008 |
| WO | 2008111947 A1 | 9/2008 |
| WO | 2009118087 A1 | 10/2009 |
| WO | 2009146770 A2 | 12/2009 |
| WO | 2010015307 A1 | 2/2010 |
| WO | 2010031485 A1 | 3/2010 |
| WO | 2010054728 A1 | 5/2010 |
| WO | 2010054731 A1 | 5/2010 |
| WO | 2010086089 A1 | 8/2010 |
| WO | 2010099852 A1 | 9/2010 |
| WO | 2010102709 A1 | 9/2010 |
| WO | 2010135519 A1 | 11/2010 |
| WO | 2011110277 A1 | 9/2011 |
| WO | 2011157339 A1 | 12/2011 |
| WO | 2012004407 A2 | 1/2012 |
| WO | 2012007086 A1 | 1/2012 |
| WO | 2012007087 A1 | 1/2012 |
| WO | 2012007088 A1 | 1/2012 |
| WO | 2013133359 A1 | 9/2013 |
| WO | 2013154064 A1 | 10/2013 |

OTHER PUBLICATIONS

Third Office Action of Chinese Patent Application No. 201680059877.5 dated Jun. 29, 2021.

Jinhuan Li, Jianhui Lu, Wang Yufeng et al., Research development of conductive inks and nanoparticles applied in conductive inks.[J]. Electronic Components and Materials, May 2014. vol.33 No.5.

International Search Report and Written Opinion for Application No. PCT/CN2016/100164 dated Dec. 30, 2016.

Liwei Chen, Jianpu Wang, Xiaogang Peng, et. al. Solution-processed, high-performance light-emitting diodes based on quantum dots, Nature, (2014) vol. 515, 15 pages.

Jiangeng Xue, Paul H. Holloway, Lei Qian, et. al. High-efficiency light-emitting devices based on quantum dots with tailored nanostructures,Nature Photonics, (2015) vol. 9, 8 pages.

Helmut Kipphan, Handbook of Print Media: Technologies and Production Methods, (2004), 40-67, 117-144, 711-730.

C. B. Murray, C. R. Kagan, M. G. Bawendi, Synthesis and Characterization of Monodisperse Nanocrystals and Close-Packed Nanocrystal Assemblies, Annual Review of Material Sci., (2000), 30, 545-610.

Jaehoon Lim, Wan Ki Bae, Jeonghun Kwak, Perspective on synthesis, device structures, and printing processes for quantum dot displays , Optical Materials Express, (2012), 2, 594-628.

Xiaogang Peng, An Essay on Synthetic Chemistry of Colloidal Nanocrystals, Nano Res, (2009), 2, 425-447.

Joel van Embden, Anthony S. R. Chesman, and Jacek J. Jasieniak, The Heat-Up Synthesis of Colloidal Nanocrystals, Chem. Mater., 2015, 27 (7), pp. 2246-2285.

Angshuman Nag, Maksym V. Kovalenko, Jong-Soo Lee, et. al., Metal-free Inorganic Ligands for Colloidal Nanocrystals: S2-,HS-,Se2-, Hse-,Te2-, The-, TeS32-,OH-, and NH2- as Surface Ligands, J. Am. Chem. Soc. (2011), 133, 10612-10620.

Jing Huang, Wenyong Liu, Dmitriy S Dolzhnikov, et. al., Surface Functionalization of Semiconductor and Oxide Nanocrystals with Small Inorganic Oxoanions (PO43-, MoO42-) and Polyoxometalate Ligands, ACS Nano, (2014), 9, 9388-9402.

C. B. Murray, D. J. Norris, M. G. Bawendi, Synthesis and Characterization of Nearly Monodisperse CdE(E=S, Se, Te) Semiconductor Nanocrystallites, J. Am. Chem. Soc., 1993, 115, 8706.

Mikhail Artemyev,Bjo1rn Mo1ller,Ulrike Woggon, Unidirectional Alignment of CdSe Nanorods, Nano Lett., (2003), 3, p. 509.

Miri Kazes, David Y. Lewis, Yuval Ebenstein, Taleb Mokari, Uri Banin, Lasing from Semiconductor Quantum Rods in a Cylindrical Microcavity, Adv. Mater. (2002), 14, p. 317.

Eli Rothenberg, Miri Kazes, Ehud Shaviv, and Uri Banin, Electric Field Induced Switching of the Fluorescence of Single Semiconductor Quantum Rods, Nano Lett. (2005), 5, p. 1581.

Loredana Protesescu, Sergii Yakunin, Maryna I. Bodnarchuk, et. al., Nanocrystals of Cesium Lead Halide Perovskites (CsPbX3, X=Cl, Br, and I): Novel Optoelectronic Materials Showing Bright Emission withWide Color Gamut, NanoLett., (2015), 15, 3692-3696.

"Feng Zhang, Haizheng Zhong, Cheng Chen, Brightly Luminescent and Color-Tunable Colloidal CH3NH3PbX3(X=Br, I, Cl) Quantum Dots: Potential Alternatives for Display Technology, ACS Nano, (2015) , 9, 4533-4542".

Ingrid C. Vreja, Seida Kabatas,Sinem K. Saka, et. al., Secondary-Ion Mass Spectrometry of Genetically Encoded Targets, Angewandte Chemie, (2015), 127(19): 5784-5788.

Guangru Li, Zhi-Kuang Tan, Dawei Di, et. al., Efficient Light-Emitting Diodes Based on Nanocrystalline Perovskite in a Dielectric Polymer Matrix, Nano Lett., (2015), 15 (4), pp. 2640-2644.

Enhai Song ,Sha Ding ,Ming Wu, et. al., Anomalous NIR Luminescence in Mn 2+ -Doped Fluoride Perovskite Nanocrystals, Adv. Optical Mater., (2014), 2, 670-678.

Dawei Di, Kevin P. Musselman, Guangru Li, Aditya Sadhanala, et. al., Size-dependent Photon Emission from Organometal Halide Perovskite Nanocrystals Embedded in an Organic Matrix, The Journal of Physical Chemistry Letters, (2015), 6(3): 446-450.

Soranyel Gonzalez-Carrero, Raquel E. Galian and Julia Pérez-Prieto, Approaching the top of the emissive properties of CH3NH3PbBr3 perovskite nanoparticles, J. Mater. Chem. A, (2015),3, 9187-9193.

Linhua Hu, Chuandao Wang, Robert M. Kennedy, et. al., The Role of Oleic Acid: From Synthesis to Assembly of Perovskite Nanocuboid Two-Dimensional Arrays, Inorg. Chem. (2015), 54, 740-745.

Chinnadurai Muthu, Sunena R. Nagamma and Vijayakumar C. Nair, Luminescent Hybrid Perovskite Nanoparticles as a New Platform for Selective Detection of 2,4,6-Trinitrophenol, RSC Adv., 2014,4, 55908-55911.

Jiaheng Zhang and Jean'ne M. Shreeve, 3,3'-Dinitroamino-4,4'-azoxyfurazan and Its Derivatives: An Assembly of Diverse N—O Building Blocks for High-Performance Energetic Materials, J. Am. Chem. Soc., 2014, 136 (3), pp. 850-853.

Oranyel González-Carrero, Raquel E. Galian, and Julia Pérez-Prieto, Organometal Halide Perovskites: Bulk Low-Dimension Materials and Nanoparticles, Part. Syst. Charact. 2015, doi: 10.1002/ppsc.201400214.

Nurxat Nuraje and Kai Su, Perovskite ferroelectric nanomaterials, Nanoscale, 2013, 5(19): 8752-8780.

Younan Xia, Yujie Xiong, Byungkwon LimAngew, et. al., Shape-Controlled Synthesis of Metal Nanocrystals: Simple Chemistry Meets Complex Physics? Chem. Int. Ed. 2009, 48, 60-103.

Hui Zhang, Mingshang Jin, and Younan Xia, Noble-Metal Nanocrystals with Concave Surfaces: Synthesis and Applications, Angew. Chem. Int. Ed. 2012, 51, 7656-7673.

Younan Xia, Peidong Yang, Yugang Sun, One-Dimensional Nanostructures: Synthesis, Characterization, and Applications, Adv. Mater. 2003, 15, No. 5, 353-389.

"Tapan K. Sau and Andrey L. Rogach, Nonspherical Noble Metal Nanoparticles: Colloid-Chemical Synthesis and Morphology Control, Adv. Mater. 2010, 22, 1781-1804".

Andrea R. Tao, Susan Habas, and Peidong Yang, Shape Control of Colloidal Metal Nanocrystals, Small.2008, 3, 310-325.

Yu Xia, Zheng Ouyang, and R. Graham Cooks, Peptide Fragmentation Assisted by Surfaces Treated with a Low-Temperature Plasma in NanoESI, Angew. Chem. Int. Ed. 2008, 47, 2-46.

(56) References Cited

OTHER PUBLICATIONS

Ayataka Endo, Mai Ogasawara, Atsushi Takahashi, et. al., Thermally Activated Delayed Fluorescence from Sn4þ -Porphyrin Complexes and Their Application to Organic Light-Emitting Diodes—A Novel Mechanism for Electroluminescence, Adv. Mater., 21, 2009, 4802.

Ayataka Endo, Keigo Sato, Kazuaki Yoshimura, et. al., Efficient up-conversion of triplet excitons into a singlet state and its application for organic light emitting diodes, Appl. Phys. Lett., 98, 2011, 083302.

Sae Youn Lee, Takuma Yasuda, Hiroko Nomura, High-efficiency organic light-emitting diodes utilizing thermally activated delayed fluorescence from triazine-based donor-acceptor hybrid molecules, Appl. Phys. Lett., 101, 2012, 093306.

Hiroyuki Tanaka, Katsuyuki Shizu, Hiroshi Miyazaki, Efficient green thermally activated delayed fluorescence (TADF) from a phenoxazine-triphenyltriazine (PXZ-TRZ) derivativew, Chem. Commun., 48, 2012, 11392.

Kenichi Goushi, Kou Yoshida, Keigo Sato et.al., Organic light-emitting diodes employing efficient reverse intersystem crossing for triplet-to-singlet state conversion, Nature Photonics, 6, 2012, 253.

Hiroki Uoyama, Kenichi Goushi, Katsuyuki Shizu, Hiroko Nomura, et.al., Highly efficient organic light-emitting diodes from delayed fluorescence, Nature, 492, 2012, 234.

Qisheng Zhang, Jie Li, Katsuyuki Shizu, et.al., Design of Efficient Thermally Activated Delayed Fluorescence Materials for Pure Blue Organic Light Emitting Diodes, J. Am. Chem. Soc, 134, 2012, 14706.

Gabor Mehes, Hiroko Nomura, Qisheng Zhang, et.al., Enhanced Electroluminescence Efficiency in a Spiro-Acridine Derivative through Thermally Activated Delayed Fluorescence, Angew. Chem. Int. Ed, 51, 2012, 11311.

Tetsuya Nakagawa,a Sung-Yu Ku,b Ken-Tsung Wong, et.al., Electroluminescence based on thermally activated delayed fluorescence generated by a spirobifluorene donor-acceptor structure, Chem. Commun., 48, 2012, 9580.

Keiro Nasu,a Tetsuya Nakagawa,a Hiroko Nomura, et.al., A highly luminescent spiro-anthracenone-based organic light-emitting diode exhibiting thermally activated delayed fluorescence, Chem. Commun., 49, 2013, 10385.

Jie Li, Tetsuya Nakagawa, Qisheng Zhang, et.al.,Highly Effi cient Organic Light-Emitting Diode Based on a Hidden Thermally Activated Delayed Fluorescence Channel in a Heptazine Derivative, Adv. Mater., 25, 2013, 3319.

Fernando B. Dias, Konstantinos N. Bourdakos, Vygintas Jankus, et.al., Triplet Harvesting with 100% Effi ciency by Way of Thermally Activated Delayed Fluorescence in Charge Transfer OLED Emitters, Adv. Mater., 25, 2013, 3707.

Takeshi Komino, Hiroko Nomura, Takahiro Koyanagi, et.al., Suppression of Efficiency Roll-Off Characteristics in Thermally Activated Delayed Fluorescence Based Organic Light-EmittingDiodes Using Randomly Oriented Host Molecules, Chem. Mater., 25, 2013, 3038.

Hiroyuki Tanaka, Katsuyuki Shizu, Hajime Nakanotani, et.al., Twisted Intramolecular Charge Transfer State for Long-Wavelength Thermally Activated Delayed Fluorescence, Chem. Mater., 25, 2013, 3766.

Jiyoung Lee, Katsuyuki Shizu, Hiroyuki Tanaka, et.al., Oxadiazole- and triazole-based highly-efficient thermally activated delayed fluorescence emitters for organic light-emitting diodes, J. Mater. Chem. C., 1, 2013, 4599.

Ryoichi Ishimatsu, Shigeyuki Matsunami, Katsuyuki Shizu, et.al., Solvent Effect on Thermally Activated Delayed Fluorescence by 1,2,3,5-Tetrakis(carbazol-9-yl)-4,6-dicyanobenzene, J. Phys. Chem. A., 117, 2013, 5607.

M. A. Baldo, M. E. Thompson, S. R. Forrest, High-efficiency fluorescent organic light-emitting devices using a phosphorescent sensitizer, Nature 403, (2000), 750-753.

Chihaya Adachi, Marc A. Baldo, Stephen R. Forrest, et. al., High-efficiency red electrophosphorescence devices, Appl. Phys. Lett.78 (2001), 1622-1624.

Unji Kido, Hiromichi Hayase, Kenichi Hongawa, et. al., Bright red lightemitting organic electroluminescent devices having a europium complex as an emitter, Appl. Phys. Lett.65 (1994), 2124.

Junji Kido, Katsutoshi Nagai, Yutaka Ohashi, Electroluminescence in a Terbium Complex,Chem. Lett. 657, 1990.

Curtis E. Johnson, Richard Eisenberg, Ted R. Evans, et. al., Luminescent Iridium(I), Rhodium(I), and Platinum(II) Dithiolate Complexes, JACS 105, 1983, 1795.

Mark Wrighton, David L. Morse, The Nature of the Lowest Excited State in Tricarbonylchloro-1, 10-phenanthrolinerhenium(I) and Related Complexes, JACS 96, 1974, 998.

Yuguang Ma, Houyu Zhang, Jiacong Shen, et. al., Electroluminescence from triplet metal-ligand charge-transfer exceited state of transition metal complexes, Synth. Metals 94, 1998, 245.

V. Bulovic. G. Gu, P. E. Burrows, et. al., Transparent light-emitting devices, Nature, 1996, 380, p. 29.

G. Gu, V. Bulovic, P. E. Burrows, et. al., Transparent organic light emitting devics, Appl. Phys. Lett. 1996, 68, p. 2606.

\* cited by examiner

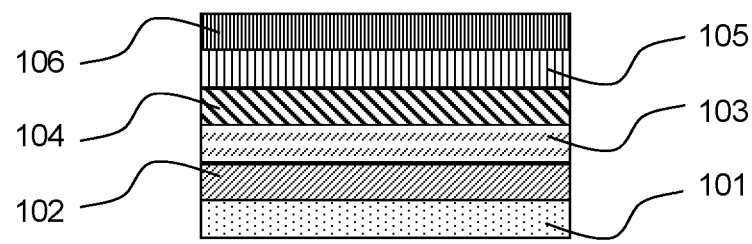

PRINTING COMPOSITION, ELECTRONIC DEVICE COMPRISING SAME AND PREPARATION METHOD FOR FUNCTIONAL MATERIAL THIN FILM

CROSS-REFERENCE TO RELATED APPLICATIONS

The present application is the national phase of International Application No. PCT/CN2016/100163, filed on Sep. 26, 2016, which claims priority to Chinese Application No. 201510770142.0, filed on Nov. 12, 2015, both of which are incorporated herein by reference in their entireties.

TECHNICAL FIELD

The present disclosure relates to a printing formulation comprising at least one functional material and at least one inorganic ester solvent. The present disclosure also relates to an electronic device comprising a functional layer prepared from the printing formulation and a preparation method of a functional material film.

BACKGROUND

Currently, organic light-emitting diodes (OLEDs), as a new generation display technology, are prepared by the evaporation process. Vacuum processes used in the preparation process typically cause low materials utilization rate of materials, while the fine metal mask (FMM) is required, resulting in high costs and low yield at the same time. High-resolution full-color display technology realized by using a printing process has been receiving more and more attention in seeking of solutions for the above problems. For example, ink jet printing can produce functional material films in a large area and with low cost. Compared with the traditional semiconductor production processes, ink jet printing is considered as a production technology with great advantages and promising potential due to low energy consumption and water consumption and is environment-friendly. Another new display technology, quantum dot light emitting diode (QLED), cannot be vaporized and must be prepared by printing. Therefore, to realize a printed display, it is necessary to solve key issues in printing inks, related printing processes, and the like. Viscosity and surface tension are important parameters that affect the printing ink and the printing process. A promising printing ink needs proper viscosity and surface tension.

Due to its solution processability, organic semiconductor materials have gained widespread attention and have made remarkable progress in the application of electronic and optoelectronic devices. Solution processability allows the organic functional material to form a film thereof in the device through some coating and printing techniques. Such technology can effectively reduce the processing costs of electronic and optoelectronic devices, meeting the process requirements of large-area preparation. Currently, several companies have reported organic semiconductor inks for printing. For example, KATEEVA, INC disclosed an ester solvent-based organic small-molecule material ink for printing OLEDs (US2015044802A1); UNIVERSAL DISPLAY CORPORATION disclosed a printable organic small-molecule material ink based on aromatic ketone or aromatic ether solvents (US 20120205637); and SEIKO EPSON CORPORATION disclosed a printable organic polymer material ink based on a substituted benzene derivative solvent. Other examples of printing inks involving organic functional materials are: CN102408776A, CN103173060A, CN103824959A, CN1180049C, CN102124588B, US2009130296A1, US2014097406A1, and the like.

Another type of functional material suitable for printing is inorganic nanomaterial, particularly quantum dots. Quantum dots are nanometer-sized semiconductor materials with quantum confinement effect. When stimulated by light or electricity, the quantum dots emit fluorescence with specific energy. The color (energy) of the fluorescence is determined by the chemical formulation, size and shape of the quantum dots. Therefore, by controlling of quantum dot size and shape, one can effectively regulate its electrical and optical properties. At present, the application of quantum dots in full-color are being studied globally, mainly focusing in the display area. Recently, quantum dots have been rapidly developed as electroluminescent devices (QLEDs) for light-emitting layers, and the device lifetimes have been greatly improved. See, for example, such as described in Peng et al., Nature Vol 515 96 (2015) and Qian et al., Nature Photonics Vol 9 259 (2015). Currently, several companies have reported quantum dot inks for printing: Nanoco Technologies Ltd in England has disclosed a method for printing ink formulations containing nanoparticles (CN101878535B). Printable nanoparticle inks and corresponding nanoparticle-containing films were obtained by selecting suitable solvents such as toluene and dodecaneselenol. Samsung Electronics disclosed a quantum dot ink for ink jet printing (U.S. Pat. No. 8,765,014B2), which contains a concentration of quantum dot materials, organic solvents and alcohol polymer additives with high viscosity. A quantum dot film was obtained by printing with the ink, and a quantum dot electroluminescent device was prepared. QD Vision Inc. disclosed a quantum dot ink formulation comprising a host material and a quantum dot material and an additive (US2010264371A1).

Other patents concerning quantum dot printing inks are: US2008277626A1, US2015079720A1, US2015075397A1, TW201340370A, US2007225402A1, US2008169753A1, US2010265307A1, US2015101665A1, and WO2008105792A2. In these published patents, these quantum dot inks contain other additives such as alcohol polymers in order to control the physical parameters of the ink. The introduction of polymer additives with insulating properties tends to reduce the charge transport capacity of the film, causing a negative impact on the optoelectronic properties of the device, and thus limits its wide application in optoelectronic devices.

SUMMARY OF THE INVENTION

In view of the above-mentioned deficiencies of the prior art, it is an object of the present disclosure to provide a printing formulation comprising at least one functional material and at least one inorganic ester solvent having the following general formula:

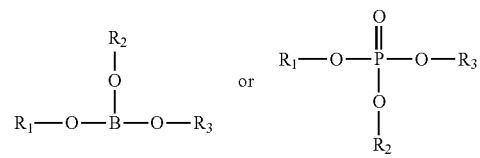

Wherein $R^1$, $R^2$, $R^3$ are each independently selected from the group consisting of H; D; a linear alkyl, alkoxy group, or thioalkoxy group having 1 to 20 carbon atoms; a branched or cyclic alkyl, alkoxy group or thioalkoxy group, or silyl group having 3 to 20 carbon atoms; a substituted ketone group having 1 to 20 carbon atoms; an alkoxycarbonyl group having 2 to 20 carbon atoms; an aryloxycarbonyl having 7 to 20 carbon atoms; cyano group, carbamoyl, haloformyl, formyl, isocyano group, isocyanate group, thiocyanate group, or isothiocyanate, hydroxy, nitro, $CF_3$, Cl, Br, and F; a substituted or unsubstituted aromatic or heteroaromatic ring group having 5 to 40 annular atoms; or an aryloxy group or heteroaryloxy group having 5 to 40 annular atoms, or a combination thereof. The inorganic ester solvent has a boiling point greater than or equal to 150° C., and can be evaporated from a solvent system to form a functional material film.

In some preferred embodiment of the present disclosure, the inorganic ester solvent has a viscosity ranging from 1 cPs to 100 cPs at 25° C.

In some preferred embodiment of the present disclosure, the inorganic ester solvent has a surface tension ranging from 19 dyne/cm to 50 dyne/cm at 25° C.

In some preferred embodiment of the present disclosure, the inorganic ester solvent is selected from the group consisting of alkyl borate or alkyl phosphate.

In some preferred embodiment of the present disclosure, the inorganic ester solvent is selected from the group consisting of tributyl borate, triamyl borate, trimethyl phosphate, triethyl phosphate, tributyl phosphate, tri(2-ethylhexyl) phosphate, triphenyl phosphate, diethyl phosphate, dibutyl phosphate, di(2-ethylhexyl) phosphate, or a combination thereof.

In some preferred embodiment of the present disclosure, the printing formulation further includes at least one other solvent, and the inorganic ester solvent accounts for more than 50% of the total weight of the mixed solvent.

In some preferred embodiment of the present disclosure, the functional material is an inorganic nano-material.

In some preferred embodiment of the present disclosure, the functional material is a quantum dot material with a particle size having a monodisperse size distribution and a shape selected from spheres, cubes, rods, or branched structures.

In some preferred embodiment of the present disclosure, the functional material is a light-emitting quantum dot material, which has an emission wavelength between 380 nm and 2500 nm.

In some preferred embodiment of the present disclosure, the printing formulation further includes an inorganic functional material selected from a binary semiconductor compound or a multinary semiconductor compound of Group IV, II-VI, II-V, III-V, III-VI, IV-VI, I-III-VI, II-IV-VI, and II-IV-V of the periodic table, or a mixture thereof.

In some preferred embodiment of the present disclosure, the functional material is a perovskite nanoparticle material.

In some preferred embodiment of the present disclosure, the functional material is a light-emitting perovskite nanoparticle material, or metal nanoparticle material, or metal oxide nanoparticle material, or a mixture thereof.

In some preferred embodiment of the present disclosure, the functional material is an organic functional material.

In some preferred embodiment of the present disclosure, the organic functional material is selected from the group consisting of hole injection materials, hole transport materials, electron transport materials, electron injection materials, electron blocking materials, hole blocking materials, emitters, or host materials.

In some preferred embodiment of the present disclosure, the organic functional material includes at least one host material and at least one emitter.

In some preferred embodiment of the present disclosure, the printing composition comprises the functional material in a weight ratio in the range of 0.3% to 30%, and the inorganic ester solvent is in a weight ratio from 70% to 99.7%.

Another object of the present disclosure is to provide an electronic device comprising a functional layer. The functional layer is prepared by printing or coating with the above-mentioned printing formulation, the inorganic ester solvent can be evaporated from the solvent system to form a functional material film.

In some preferred embodiment of the present disclosure, the electronic device may be selected from quantum dot light emitting diodes, quantum dot photovoltaic cells, quantum dot light emitting electrochemical cells, quantum dot field effect transistors, quantum dot light emitting field effect transistors, quantum dot lasers, quantum dot sensors, organic light-emitting diodes, organic photovoltaic cells, organic light-emitting electrochemical cells, organic field effect transistors, organic light-emitting field effect transistors, organic lasers, or organic sensors.

Another object of the present disclosure is to provide a preparation method of a functional material film, wherein the above-mentioned printing formulation is coated on a substrate by a printing or coating method, wherein the printing or coating method may be selected from ink-jet printing, nozzle printing, typography, screen printing, dip coating, spin coating, blade coating, roll printing, torsion printing, lithography, flexography, rotary printing, spray printing, brush coating, pad printing, or slit type extrusion coating.

Advantages

The present disclosure provides a printing formulation, which can have its viscosity and surface tension adjusted to a suitable range according to a specific printing method, particularly ink jet printing, to facilitate printing, so as to form a film having a uniform surface. At the same time, the solvent can be effectively removed by post-treatment, such as heat treatment or vacuum treatment, which can ensure the performance of the electronic device. The present disclosure therefore provides an ink for the preparation of high quality functional films, in particular printing inks comprising quantum dots and organic semiconductor materials, providing technical solutions for printable electronic or optoelectronic devices.

ACCOMPANYING DRAWING ILLUSTRATION

FIG. 1 is a structural diagram of a preferred light emitting device according to the present disclosure, wherein 101 is a substrate, 102 is an anode, 103 is a hole injection layer (HIL) or a hole transport layer (HTL), 104 is a light emitting layer (electroluminescent device) or light absorbing layer (photovoltaic cell), 105 is an electron injection layer (EIL) or electron transport layer (ETL), and 106 is a cathode.

DETAILED DESCRIPTION OF EMBODIMENTS

The present disclosure provides a printing formulation; the printing formulation provided comprises at least one functional material and at least one inorganic ester solvent. In some preferred embodiments, the inorganic ester solvent has a viscosity ranging from 1 cPs to 100 cPs at 25° C., a surface tension ranging from 19 dyne/cm to 50 dyne/cm at 25° C., and a boiling point greater than 150° C. The present disclosure also relates to an electronic device comprising the printing formulation and a preparation method of a functional material film.

The present disclosure will now be described in greater detail so that the purpose, technical solutions, and technical effects thereof are more clear and comprehensible. It is to be understood that the detailed illustration and specific embodiments described herein are merely illustrative of, and are not intended to limit, the present disclosure.

In the present disclosure, printing formulation, printing ink and ink have the same meaning and are used interchangeably.

The present disclosure provides a printing formulation comprising at least one functional material and at least one inorganic ester solvent having the following general formula:

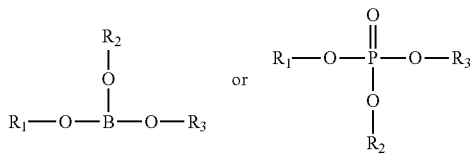

Wherein $R^1$, $R^2$, $R^3$ are each optionally H; or D; or a linear alkyl, alkoxy group, or thioalkoxy group having 1 to 20 carbon atoms; or a branched or cyclic alkyl, alkoxy group or thioalkoxy group, or silyl group having 3 to 20 carbon atoms; or a substituted ketone group having 1 to 20 carbon atoms; or an alkoxycarbonyl group having 2 to 20 carbon atoms; or an aryloxycarbonyl having 7 to 20 carbon atoms; cyano group (—CN), carbamoyl (—C(=O)NH$_2$), haloformyl (—C(=O)—X, wherein X represents a halogen atom), formyl (—C(=O)—H), isocyano group, isocyanate group, thiocyanate group, or isothiocyanate, hydroxy, nitro, CF$_3$, Cl, Br, F, and a crosslinkable group; or a substituted or unsubstituted aromatic or heteroaromatic ring group having 5 to 40 annular atoms; or an aryloxy group or heteroaryloxy group having 5 to 40 annular atoms, or a combination of these systems.

In some preferred embodiment, $R^1$, $R^2$, $R^3$ are each optionally H; or D; or a linear alkyl, alkoxy group, or thioalkoxy group having 1 to 10 carbon atoms; or a branched or cyclic alkyl, alkoxy group or thioalkoxy group, or silyl group having 3 to 10 carbon atoms; or a substituted ketone group having 1 to 10 carbon atoms; or an alkoxycarbonyl group having 2 to 10 carbon atoms; or an aryloxycarbonyl having 7 to 10 carbon atoms; cyano group (—CN), carbamoyl (—C(=O)NH$_2$), haloformyl (—C(=O)—X, wherein X represents a halogen atom), formyl (—C(=O)—H), isocyano group, isocyanate group, thiocyanate group, or isothiocyanate, hydroxy, nitro, CF$_3$, Cl, Br, F, and a crosslinkable group; or a substituted or unsubstituted aromatic or heteroaromatic ring group having 5 to 20 annular atoms; or an aryloxy group or heteroaryloxy group having 5 to 20 annular atoms, or a combination of these systems.

The inorganic ester solvent included according to the printing formulation of the present disclosure has a boiling point greater than or equal to 150° C. The inorganic ester solvent can be evaporated from the solvent system to form a film of functional material.

When selecting an inorganic ester based-solvent for dissolving the functional material, its boiling point parameter should be taken into consideration. In certain embodiments, the boiling point of the inorganic ester based-solvent is ≥180° C. In certain preferred embodiments, the boiling point of the inorganic ester based-solvent is ≥200° C. or 220° C. In certain embodiments, the boiling point of the inorganic ester based-solvent is ≥250° C. In some other preferred embodiments, the boiling point of the inorganic ester based-solvent is ≥275° C. or ≥300° C. Boiling points in these ranges are beneficial for preventing nozzle clogging of inkjet print heads. The inorganic ester based-solvent may be evaporated from the solvent system to form a film containing the functional material.

According to the present disclosure, the printing formulation includes at least one inorganic ester solvent having a viscosity ranging from 1 cPs to 100 cPs at 25° C.

When selecting the inorganic ester based-solvent for dissolving the functional material, its viscosity parameter in the ink should be taken into consideration. The viscosity can be adjusted by various methods, such as by selecting the appropriate solvent and the concentration of the function material in the ink. According to the solvent system of the present disclosure including the inorganic ester based-solvent, the printing ink may be conveniently adjusted in the appropriate range according to the printing method used. In general, the printing formulation according to the present disclosure comprises the functional material in a weight ratio in the range of 0.3 wt % to 30 wt %, preferably the printing formulation according to the present disclosure comprises the functional material in a weight ratio in the range of 0.5 wt % to 20 wt %, more preferably the printing formulation according to the present disclosure comprises the functional material in a weight ratio in the range of 0.5 wt % to 15 wt %, and most preferably the printing formulation according to the present disclosure comprises the functional material in a weight ratio in the range of 0.5 wt % to 10 wt %. In a preferred embodiment, the inorganic ester based-solvent has a viscosity less than 100 cps; in a more preferred embodiment, the inorganic ester based-solvent has a viscosity less than 50 cps; in a most preferred embodiment, the inorganic ester based-solvent has a viscosity in the range of 1.5 cps to 20 cps. The viscosity here refers to a viscosity at the ambient temperature at the time of printing, generally 15-30° C., preferably 18-28° C., more preferably 20-25° C., and most preferably 23-25° C. The printing formulation thus prepared will be particularly suitable for ink jet printing.

In a preferred embodiment, the printing formulation according to the present disclosure, as prepared at above ratios, has a viscosity at 25° C. in the range of about 1 cps to about 100 cps, more preferably the printing formulation according to the present disclosure, as prepared at above ratios, has a viscosity at 25° C. in the range of 1 cps to 50 cps, most preferable the printing formulation according to the present disclosure, as prepared at above ratios, has a viscosity at 25° C. in the range of 1.5 cps to 20 cps.

The printing formulation according to the present disclosure comprises at least one inorganic ester solvent having a surface tension in a range of 19 dyne/cm to 50 dyne/cm at 25° C.

When selecting the inorganic ester based-solvent for dissolving the functional material, its surface tension parameter should be taken into consideration. Appropriate surface tension parameter of the ink is suitable to the specific substrate and the specific printing method. For example, for ink jet printing, in a preferred embodiment, the inorganic ester based-solvent has a surface tension at 25° C. in the range of about 19 dyne/cm to about 50 dyne/cm. In a more preferred embodiment, the inorganic ester based-solvent has a surface tension at 25° C. in the range of about 22 dyne/cm to about 35 dyne/cm. In a most preferred embodiment, the inorganic ester based-solvent has a surface tension at 25° C. in the range of about 25 dyne/cm to about 33 dyne/cm.

In a preferred embodiment, the printing formulation according to the present disclosure has a surface tension at 25° C. in the range of about 19 dyne/cm to 50 dyne/cm, more preferably the printing formulation according to the present disclosure has a surface tension at 25° C. in the range of 22 dyne/cm to 35 dyne/cm, and most preferably the printing formulation according to the present disclosure has a surface tension at 25° C. in the range from 25 dyne/cm to 33 dyne/cm.

An ink obtained from the solvent system based on inorganic ester satisfying the above-mentioned boiling point, surface tension parameters and viscosity parameters can form a functional material film having a uniform thickness and formulational properties.

In a preferred embodiment, according to the printing formulation the present disclosure, the inorganic ester solvent is selected from the group consisting of alkyl borate and alkyl phosphate.

The inorganic ester solvent suitable for the present disclosure may be selected from the, but not limited to, tributyl borate, triamyl borate, trimethyl phosphate, triethyl phosphate, tributyl phosphate, tri(2-ethylhexyl) phosphate, triphenyl phosphate, diethyl phosphate, dibutyl phosphate, di(2-ethylhexyl) phosphate, and the like.

In some preferred embodiments, the present disclosure relates to the printing formulation including a single inorganic ester based-solvent. The single inorganic ester based-solvent may be preferably selected from the group consisting of tributyl borate, triamyl borate, triethyl phosphate, and triphenyl phosphate.

In some other preferred embodiments, the present disclosure relates to the printing formulation comprising a mixture of two or more inorganic ester based-solvents.

In some preferred embodiments, the inorganic ester based-solvent included in the printing formulation involved in the present disclosure is a mixture of triphenyl phosphate and triethyl phosphate, and triphenyl phosphate accounts for more than 50%, preferably the triphenyl phosphate accounts for more than 70%, most preferably the triphenyl phosphate accounts for more than 90%, of the total weight of the mixed solvent.

In some preferred embodiments, the inorganic ester based-solvent included in the printing formulation involved in the present disclosure is a mixture of triphenyl phosphate and triamyl borate, and triphenyl phosphate accounts for more than 50%, preferably the triphenyl phosphate accounts for more than 70%, most preferably the triphenyl phosphate accounts for more than 90%, of the total weight of the mixed solvent.

In certain embodiments, the printing formulation according to the present disclosure further includes at least another organic solvent, wherein the inorganic ester solvent accounts for more than 50% of the total weight of the mixed solvent. Preferably, the inorganic ester solvent included accounts for at least 70% of the total weight of the solvent. More preferably, the inorganic ester solvent included accounts for at least 80% of the total weight of the solvent. Most preferably, the solvent system based on the inorganic ester includes inorganic ester solvent in a weight ratio of at least 90% or is basically consisted of the inorganic ester solvent, or is completely consisted of the inorganic ester solvent.

In some preferred embodiments, the above-mentioned another organic solvent is selected from the group consisting of aromatic or heteroaromatic solvent; or alcohol group, or ether group, or ketone group, or ester group, or aldehyde group-based solvent.

In some other preferred embodiments, the examples of the above-mentioned another organic solvent include, but are not limited to, methanol, ethanol, 2-methoxy ethanol, methylene chloride, chloroform, chlorobenzene, o-dichlorobenzene, tetrahydrofuran, anisole, morpholine, toluene, o-xylene, m-xylene, p-xylene, 1,4-dioxane, acetone, methyl ethyl ketone, 1,2-dichloroethane, 3-phenoxy toluene, 1,1,1-trichloroethane, 1,1,2,2-tetrachloroethane, ethyl acetate, butyl acetate, dimethylformamide, dimethylacetamide, dimethyl sulfoxide, tetrahydronaphthalene, decalin, indene, and/or mixtures thereof.

The solvent system based on inorganic ester according to the present disclosure can dissolve the functional material effectively, i.e., as a new solvent to replace the traditionally used solvent for dissolving the functional materials, such as toluene, xylene, chloroform, chlorobenzene, dichlorobenzene, heptanes, and the like.

The printing ink may also additionally comprise one or more components such as surface-active compounds, lubricants, wetting agents, dispersants, hydrophobic agents, binders, and the like, for the purpose of viscosity adjustment, film-forming properties, and adhesion enhancement, for example.

The printing ink of the present disclosure can be deposited into a functional film by various techniques. Suitable printing or coating techniques include, but are not limited to, ink-jet printing, nozzle printing, typography, screen printing, dip coating, spin coating, blade coating, roll printing, torsion printing, lithography, flexography, rotary printing, spray printing, brush coating, pad printing, or slit type extrusion coating, and the like. The preferred printing techniques are inkjet printing, spray printing, and gravure printing. For more information on printing technology and its related requirements for inks, such as solvents, concentrations, and viscosity, and the like, see "Print media book: Technology and production methods" (Handbook of Print Media: Technologies and Production Methods.)), ISBN 3-540-67326-1 edited by Helmut Kipphan. In general, different printing technologies have different requirements for characteristics of the inks used. For example, for a printing ink suitable for ink jet printing, it is necessary to regulate the surface tension, viscosity, and wettability of the ink so that the ink can be ejected through the nozzle at a printing temperature (e.g., room temperature, 25° C.) without any problem, avoiding drying on the nozzle or clogging the nozzle, or facilitating formation of a continuous, flat and defect-free film on a specific substrate.

The printing formulation according to the disclosure comprises at least one functional material.

In the present disclosure, the functional material preferentially refers to a material having some photoelectric functions. The photoelectric functions include, but are not limited to, hole injection function, hole transport function, electron transport function, electron injection function, electron blocking function, hole blocking function, light emitting function, and host function. The corresponding functional materials are called hole injection material (HIM), hole transport material (HTM), electron transport material (ETM), electron injection material (EIM), electron blocking material (EBM), hole blocking material (HBM)), Emitter, and Host.

The functional materials can be organic or inorganic materials.

In a preferred embodiment, the at least one functional material comprised in the printing formulation according to the present disclosure is an inorganic nanomaterial.

Preferably, in the printing formulation, the at least one inorganic nanomaterial is an inorganic semiconductor nanoparticle material.

In the present disclosure, the inorganic nanomaterial has an average particle size in the range of about 1 to 1000 nm. In some preferred embodiments, the inorganic nanomaterial has an average particle size of about 1 to 100 nm. In some more preferred embodiments, the inorganic nanomaterials have an average particle size of about 1 to 20 nm, preferably 1 to 10 nm.

The inorganic nanomaterials may be selected from different shapes, including but not limited to different nano-topographies such as spheres, cubes, rods, discs, or branched structures, and a mixture of particles of various shapes.

In a preferred embodiment, the inorganic nanomaterial is a quantum dot material having a very narrow, monodisperse size distribution, i.e., the size difference among the particles is very small. Preferably, the monodispersed quantum dots have a root-mean-square (RMS) deviation less than 15% rms in size; more preferably, the monodispersed quantum dots have a RMS deviation in size less than 10% rms; and most preferably, monodisperse the RMS deviation of the monodispersed quantum dots is less than 5% rms.

In a preferred embodiment, the inorganic nanomaterial is a light-emitting material.

In a more preferred embodiment, the light-emitting inorganic nanomaterial is a quantum dot light-emitting material.

In general, light emitting quantum dots can emit light at a wavelength of 380 nanometers to 2500 nanometers. For example, it has been found that the quantum dots with a CdS core have an emission wavelength in the range of about 400 nm to 560 nm; the quantum dots with a CdSe core have an emission wavelength in the range of about 490 nm to 620 nm; the quantum dots with CdTe cores have an emission wavelength in the range of about 620 nanometers to 680 nanometers; the quantum dots with a InGaP core have an emission wavelength in the range of about 600 nanometers to 700 nanometers; the quantum dots with a PbS core have an emission wavelength in the range of about 800 nanometers to 2500 nanometers; the quantum dots with a PbSe core have an emission wavelength in the range of about 1200 nm to 2500 nm; the quantum dots with a CuInGaS core have an emission wavelength in the range of about 600 nm to 680 nm; the quantum dots with a ZnCuInGaS core have an emission wavelength in the range of about 500 nm to 620 nm; and the quantum dot with a CuInGaSe core have an emission wavelength in the range of about 700 nm to 1000 nm.

In a preferred embodiment, the quantum dot material includes at least one emitting blue light with a peak luminous wavelength of 450 nm to 460 nm, or green light with a peak luminous wavelength of 520 nm to 540 nm, or red light with a peak luminous wavelength of 615 nm to 630 nm, or their mixture.

Quantum dots included may be selected for particular chemical formulations, topographical structures, and/or size dimensions to obtain light that emits a desired wavelength under electrical stimulation. The relationship between the luminescent properties of quantum dots and their chemical formulation, morphology structure and/or size can be found in Annual Review of Material Sci., 2000, 30, 545-610; Optical Materials Express., 2012, 2, 594-628; and Nano Res, 2009, 2, 425-447. The entire contents of the above listed patent documents are hereby incorporated by reference.

The narrow particle size distribution of quantum dots enables them to have a narrower luminescence spectrum (J. Am. Chem. Soc., 1993, 115, 8706; and US 20150108405). In addition, depending on the various chemical formulation and structure used, the size of the quantum dots needs to be adjusted within the above-mentioned size range to obtain the luminescent properties of the desired wavelength.

Preferably, the light emitting quantum dots are semiconductor nanocrystals. In general, the size of the semiconductor nanocrystals is in the range of about 2 nanometers to about 15 nanometers. In addition, depending on the various chemical formulation and structure used, the size of the quantum dots needs to be adjusted within the above-mentioned size range to obtain the luminescent properties of the desired wavelength.

The semiconductor nanocrystal includes at least one semiconductor material, wherein the semiconductor material may be selected from binary or polybasic semiconductor compounds of Group IV, II-VI, II-V, III-V, III-VI, IV-VI, I-III-VI, II-IV-VI, and II-IV-V of the periodic table, or their mixtures. Examples of specific semiconductor materials include, but are not limited to: Group IV semiconductor compounds, including elemental Si, Ge and binary compounds SiC, SiGe; Group II-VI semiconductor compounds, including: binary compounds including CdSe, CdTe, CdO, CdS, CdSe, ZnS, ZnSe, ZnTe, ZnO, HgO, HgS, HgSe, and HgTe, ternary compounds including CdSeS, CdSeTe, CdSTe, CdZnS, CdZnSe, CdZnTe, CgHgS, CdHgSe, ZnSeS, ZnSeTe, ZnSTe, HgSeS, HgSeTe, HgSTe, HgZnS, and HgSeSe, and quaternary compounds including CgHgSeS, CdHgSeTe, CgHgSTe, CdZnSeS, CdZnSeTe, HgZnSeTe, HgZnSTe, CdZnSTe, and HgZnSeS; Group III-V semiconductor compounds, including: binary compounds including AlN, AlP, AlAs, AlSb, GaN, GaP, GaAs, GaSb, InN, InP, InAs, and InSb, ternary compounds including AlNP, AlNAs, AlNSb, AlPAs, AlPSb, GaNP, GaNAs, GaNSb, GaPAs, GaPSb, InNP, InNAs, InNSb, InPAs, and InPSb, and quaternary compounds include GaAlNAs, GaAlNSb, GaAlPAs, GaInNP, GaInNAs, GaInNSb, GaInPAs, GaInPSb, InAlNP, InAlNAs, InAlNSb, InAlPAs, and InAlPSb; Group IV-VI f semiconductor compounds, including: binary compounds including SnS, SnSe, SnTe, PbSe, PbS, and PbTe, ternary compounds including SnSeS, SnSeTe, SnSTe, SnPbS, SnPbSe, SnPbTe, PbSTe, PbSeS, and PbSeTe, and quaternary compounds including SnPbSSe, SnPbSeTe, and SnPbSTe.

In a preferred embodiment, the light emitting quantum dot comprises a Group II-VI semiconductor material, preferably selected from the group consisting of CdSe, CdS, CdTe, ZnO, ZnSe, ZnS, ZnTe, HgS, HgSe, HgTe, CdZnSe, and any combination thereof. In a suitable embodiment, this material is used as light-emitting quantum dots for visible light due to the relatively well-established synthesis scheme of CdSe and CdS.

In another preferred embodiment, the light emitting quantum dots comprise a Group III-V semiconductor material, preferably selected from the group consisting of InAs, InP, InN, GaN, InSb, InAsP, InGaAs, GaAs, GaP, GaSb, AlP, AlN, AlAs, AlSb, CdSeTe, ZnCdSe, and any combination thereof.

In another preferred embodiment, the light emitting quantum dots comprise Group IV-VI semiconductor materials, preferably selected from the group consisting of PbSe, PbTe, PbS, PbSnTe, $Tl_2SnTe_5$, and any combination thereof.

In a preferred embodiment, the quantum dots have a core-shell structure. The core and the shell respectively include one or more identical or different semiconductor materials.

The core of the quantum dots may be selected from binary or polybasic semiconductor compounds of Group IV, II-VI, II-V, III-V, III-VI, IV-VI, I-III-VI, II-IV-VI, and II-IV-V of the periodic table. Specific examples used as quantum dot cores include but are not limited to ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InSb, AlAs, AlN, AlP, AlSb, PbO, PbS, PbSe, PbTe, Ge, Si, and an alloy or a mixture of any combination thereof.

The shell of the quantum dots comprises the same or different semiconductor material as the core. Semiconductor materials that can be used for the shell include binary or polybasic semiconductor compounds of Group Group IV, II-VI, II-V, III-V, III-VI, IV-VI, I-III-VI, II-IV-VI, and II-IV-V of the periodic table. Specific examples for quantum dot cores include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InSb, AlAs, AlN, AlP, AlSb, PbO, PbS, PbSe, PbTe, Ge, Si, and an alloy or a mixture of any combination thereof.

In the quantum dots having a core-shell structure, the shell may comprise a monolayer or multilayer structure. The shell comprises one or more semiconductor materials that are the same as or different from the core. In a preferred embodiment, the shell has a thickness of about 1 to 20 layers. In a more preferred embodiment, the shell has a thickness of about 5 to 10 layers. In certain embodiments, two or more shells are comprised on the surface of the quantum dot core.

In a preferred embodiment, the semiconductor material used for the shell has a larger bandgap than the core. Particularly preferred, the core has a type I semiconductor heterojunction structure.

In another preferred embodiment, the semiconductor material used for the shell has a smaller bandgap than the core.

In a preferred embodiment, the semiconductor material used for the shell has the same or similar atomic crystal structure as the core. This choice is conducive to reducing the stress between the core and shell, making the quantum dots more stable.

Examples of suitable light-emitting quantum dots employing core-shell structures are (but not limited to):

Red light: CdSe/CdS, CdSe/CdS/ZnS, CdSe/CdZnS, and the like;

Green light: CdZnSe/CdZnS, CdSe/ZnS, and the like;

Blue light: CdS/CdZnS, CdZnS/ZnS, and the like.

The preferred method for preparing the quantum dots is a colloidal growth method. In a preferred embodiment, the method of preparing the monodispersed quantum dots is selected from the group consisting of hot-injection and/or heating-up. Preparation methods are described in the document Nano Res, 2009, 2, 425-447; *Chem. Mater.*, 2015, 27 (7), pp 2246-2285. The contents of the above listed documents are hereby incorporated by reference in their entirety.

In a preferred embodiment, the surface of the quantum dot contains an organic ligand. The organic ligand can control the growth process, regulate the morphology, and reduce the surface defects of the quantum dots, so as to improve the luminous efficiency and stability of the quantum dots. The organic ligand may be selected from the group consisting of pyridine, pyrimidine, furan, amine, alkyl phosphine, alkyl phosphine oxide, alkyl phosphonic acid or alkyl phosphinic acid, alkyl thiol, and the like. Examples of specific organic ligands include but are not limited to tri-n-octylphosphine, tri-n-octylphosphine oxide, trihydroxypropylphosphine, tributylphosphine, tri(dodecyl)phosphine, dibutyl phosphite, tributyl phosphite, octadecyl phosphite, trilauryl phosphite, tridodecyl phosphite, triisodecyl phosphite, bis(2-ethylhexyl) phosphate, tri(tridecyl)phosphate, hexadecylamine, oleylamine, octadecylamine, dioctadecylamine, trioctadecylamine, bis(2-ethylhexyl)amine, octylamine, dioctylamine, trioctylamine, dodecylamine, didodecylamine, tridodecylamine, hexadecylamine, phenylphosphoric acid, hexylphosphonic acid, tetradecylphosphonic acid, octylphosphonic acid, n-octadecylphosphonic acid, propylene diphosphonic acid, dioctyl ether, diphenyl ether, octanethiol, and dodecanethiol.

In another preferred embodiment, the surface of the quantum dot comprises an inorganic ligand. Quantum dots protected by inorganic ligands can be obtained by ligand exchange of organic ligands on the surface of quantum dots. Examples of specific inorganic ligands include but are not limited to: $S^{2-}$, $HS^-$, $Se^{2-}$, $HSe^-$, $Te^{2-}$, $HTe^-$, $TeS_3^{2-}$, $OH^-$, $NH_2^-$, $PO_4^{3-}$, $MoO_4^{2-}$, and the like. Examples of such inorganic ligand quantum dots can be found in documents: J. Am. Chem. Soc. 2011, 133, 10612-10620; and ACS Nano, 2014, 9, 9388-9402. The contents of the above listed documents are hereby incorporated by reference in their entirety.

In certain embodiments, the quantum dot has one or more of the same or different ligands on the surface.

In a preferred embodiment, the luminescence spectrum exhibited by the monodispersed quantum dots has a symmetrical peak shape and a narrow half-width. In general, the better the monodispersity of a quantum dot, the more symmetrical the luminescence peak it exhibits and the narrower the half-value width. Preferably, the luminescence half-width of the quantum dots is less than 70 nanometers; more preferably, the luminescence half-width of the quantum dots is less than 40 nanometers; and most preferably, the luminescence half-width of the quantum dot is less than 30 nm.

In general, the quantum efficiency of the quantum dots is greater than 10%, preferably the quantum efficiency of the quantum dots is greater than 50%, more preferably the quantum efficiency of the quantum dots is greater than 60%, and most preferably the quantum efficiency of the quantum dots is greater than 70%.

Other information quantum dot-related materials, techniques, methods, applications, and the like that may be useful in the present disclosure are described in the following patent documents: WO2007/117698, WO2007/120877, WO2008/108798, WO2008/105792, WO2008/111947, WO2007/092606, WO2007/117672, WO2008/033388, WO2008/085210, WO2008/13366, WO2008/063652, WO2008/063653, WO2007/143197, WO2008/070028, WO2008/063653, U.S. Pat. Nos. 6,207,229, 6,251,303, 6,319,426, 6,426,513, 6,576,291, 6,607,829, 6,861,155, 6,921,496, 7,060,243, 7,125,605, 7,138,098, 7,150,910, 7,470,379, 7,566,476, and WO2006134599A1, which are hereby incorporated by reference in their entireties.

In another preferred embodiment, the light emitting semiconductor nanocrystals are nanorods. Nanorods have different properties from spherical nanocrystallites. For example, the luminescence of the nanorods is polarized along the long rod axis, while the luminescence of the spherical grains is non-polarized (see Woggon et al., Nano Lett., 2003, 3, p509). Nanorods have excellent optical gain properties, making them potentially useful as laser gain materials (see Banin et al. Adv. Mater. 2002, 14, p 317). In addition, the luminescence of the nanorods can be turned on and off reversibly under the control of an external electric field (see Banin et al., Nano Lett. 2005, 5, p 1581). These properties of nanorods can be preferentially incorporated into the device of the present disclosure under certain conditions. Examples of the preparation of semiconductor nanorods are WO03097904A1, US2008188063A1, US2009053522A1, and KR20050121443A, the entire contents of which are hereby incorporated by reference.

In other preferred embodiments, in the printing formulation according to the disclosure, the inorganic nanomaterial is a perovskite nanoparticle material, in particular a light emitting perovskite nanoparticle material.

The perovskite nanoparticle material has a structural formula of $AMX_3$ wherein A can be selected from organic amines or alkali metal cations, M can be selected from metal cations, and X can be selected from oxygen or a halide anion. Specific examples include but are not limited to: $CsPbCl_3$, $CsPb(Cl/Br)_3$, $CsPbBr_3$, $CsPb(I/Br)_3$, $CsPbI_3$, $CH_3NH_3PbCl_3$, $CH_3NH_3Pb(Cl/Br)_3$, $CH_3NH_3PbBr_3$, $CH_3NH_3Pb(I/Br)_3$, $CH_3NH_3PbI_3$, and so on. The literature on perovskite nanoparticle materials is for example *Nano-Lett.*, 2015, 15, 3692-3696; ACS Nano, 2015, 9, 4533-4542; Angewandte Chemie, 2015, 127(19): 5785-5788; *Nano Lett.*, 2015, 15 (4), pp 2640-2644; Adv. Optical Mater. 2014, 2, 670-678; The Journal of Physical Chemistry Letters, 2015, 6(3): 446-450; J. Mater. Chem. A, 2015, 3, 9187-9193; Inorg. Chem. 2015, 54, 740-745; RSC Adv., 2014, 4, 55908-55911; *J. Am. Chem. Soc.*, 2014, 136 (3), pp 850-853; Part. Part. Syst. Charact. 2015, doi: 10.1002/ppsc.201400214; and Nanoscale, 2013, 5(19): 8752-8780. The entire contents of the above listed patent documents are hereby incorporated by reference.

In another preferred embodiment, the inorganic nanomaterial is a metal nanoparticle material in the printing formulation according to the present disclosure. Particularly preferred are light-emitting metal nanoparticle materials.

The metal nanoparticles include, but are not limited to nanoparticles of chromium (Cr), molybdenum (Mo), tungsten (W), ruthenium (Ru), rhenium (Rh), nickel (Ni), silver (Ag), copper (Cu), Zinc (Zn), Palladium (Pd), Gold (Au), Hungry (Os), Re, Iridium (Ir) and Platinum (Pt). The types, morphology and synthesis methods of common metal nanoparticles can be found in: Angew. Chem. Int. Ed. 2009, 48, 60-103; Angew. Chem. Int. Ed. 2012, 51, 7656-7673; Adv. Mater. 2003, 15, No. 5, 353-389; Adv. Mater. 2010, 22, 1781-1804; Small. 2008, 3, 310-325; and Angew. Chem. Int. Ed. 2008, 47, 2-46, et al., and references cited therein, which are hereby incorporated by reference in their entireties.

In another preferred embodiment, the inorganic nanomaterial has charge transport capability.

In a preferred embodiment, the inorganic nanomaterial has electron transport capability. Preferably, such inorganic nanomaterials are selected from n-type semiconductor materials. Examples of n-type inorganic semiconductor materials include, but are not limited to, metal chalcogenides, metal-phosphorus compounds, or elemental semiconductors such as metal oxides, metal sulfides, metal selenides, metal tellurides, metal nitrides, metal phosphide, or metal arsenide. The preferred n-type inorganic semiconductor material is selected from the group consisting of ZnO, ZnS, ZnSe, TiO2, ZnTe, GaN, GaP, AlN, CdSe, CdS, CdTe, CdZnSe, and any combination thereof.

In some embodiments, the inorganic nanomaterial has hole transport capability. Preferably, such inorganic nanomaterials are selected from p-type semiconductor materials.

The inorganic p-type semiconductor material may be NiOx, WOx, MoOx, RuOx, VOx, CuOx, and any combination thereof.

In some embodiments, the printing ink according to the present disclosure comprises at least two or more inorganic nanomaterials.

In another particularly preferred embodiment, the printing formulation according to the present disclosure comprises at least one organic functional material.

The organic functional materials include, but are not limited to, hole (also called electron hole) injection or transport material (HIM/HTM), hole blocking material (HBM), electron injection or transport material (EIM/ETM), electron blocking material (EBM), organic host material (Host), singlet emitter (fluorescent emitter), thermally activated delayed fluorescent emitter (TADF), triplet emitter (phosphorescent emitter), in particular, organic emitting metal complexes, and organic dyes. Various organic functional materials are described in detail in, for example, WO2010135519A1, US20090134784A1, and WO2011110277A1, the entire contents of which are hereby incorporated by reference.

In general, the solubility of the organic functional material in the inorganic ester solvent according to the present disclosure is at least 0.2 wt %, preferably the solubility of the organic functional material in the inorganic ester solvent according to the present disclosure is at least 0.3 wt %, more preferably the solubility of the organic functional material in the inorganic ester solvent according to the present disclosure is at least 0.6 wt %, still more preferably the solubility of the organic functional material in the inorganic ester solvent according to the present disclosure is at least 1.0 wt %, and most preferably the solubility of the organic functional material in the inorganic ester solvent according to the present disclosure is at least 1.5 wt %.

Organic functional materials can be small molecules and polymer materials. In the present disclosure, a small-molecule organic material refers to a material having a molecular weight of at most 4000 g/mol, and a material having a molecular weight of more than 4000 g/mol is collectively referred to as a polymer.

More detailed descriptions of the organic small-molecule functional materials will be given below for preferred embodiments, but not limited thereto.

In a preferred embodiment, the functional material comprised in the printing formulation according to the present disclosure is an organic small-molecule material.

In certain preferred embodiments, in the printing formulation according to the present disclosure, the organic functional material comprises at least one host material and at least one emitter.

In a preferred embodiment, the organic functional material comprises a host material and a singlet emitter.

In another preferred embodiment, the organic functional material comprises a host material and a triplet emitter.

In another preferred embodiment, the organic functional material comprises a host material and a thermally activated delayed fluorescent light emitting material.

In other preferred embodiments, the organic functional material comprises a hole transport material (HTM). More preferably, the HTM comprises a crosslinkable group.

More detailed descriptions of the organic small-molecule functional materials will be given below for preferred embodiments, but not limited thereto.

1. HIM/HTM/EBM

Suitable organic HIM/HTM materials for use may include compounds having the following structural units: phthalocyanines, porphyrins, amines, aryl amines, biphenyl triaryl amines, thiophenes, thiophenes such as dithiophenethiophene and thiophthene, pyrrole, aniline, carbazole, indenofluorene, and derivatives thereof. Other suitable HIMs also include: fluorocarbon-containing polymers; polymers comprising conductive dopants; and conductive polymers such as PEDOT/PSS.

The electron-blocking layer (EBL) used is typically used to block electrons from adjacent functional layers, particularly light emitting layers. In contrast to a light-emitting device without a blocking layer, the presence of EBL usually results in an increase in luminous efficiency. The electron-blocking material (EBM) of the electron-blocking layer (EBL) requires a higher LUMO than the adjacent functional layer, such as the light emitting layer. In a preferred embodiment, the EBM has a greater level of excited energy than the adjacent light-emitting layer, such as a singlet or triplet level, depending on the emitter. In another preferred embodiment, the EBM has a hole-transport function. HIM/HTM materials, which typically have high LUMO levels, can be used as EBM.

Examples of cyclic aromatic amine-derived compounds that can be used as HIM, HTM, or EBM may include, but are not limited to, the general structure as follows:

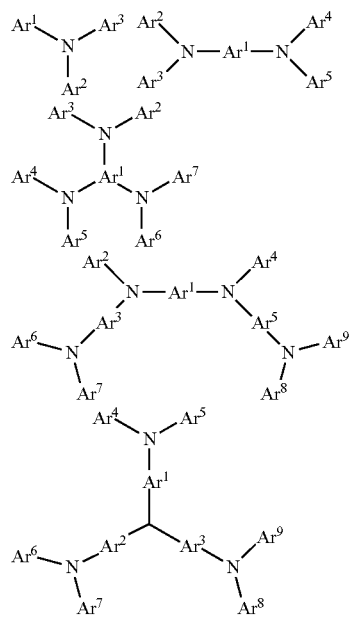

wherein each $Ar^1$ to $Ar^9$ may be independently selected from: cyclic aryl groups such as benzene, biphenyl, triphenyl, benzo, naphthalene, anthracene, phenalene, phenanthrene, fluorene, pyrene, chrysene, perylene, azulene; and aromatic heterocyclic groups such as dibenzothiophene, dibenzofuran, furan, thiophene, benzofuran, benzothiophene, benzoselenophene, carbazole, pyrazole, imidazole, triazole, isoxazole, thiazole, oxadiazole, oxatriazole, dioxazole, thiadiazole, pyridine, pyridazine, pyrimidine, pyrazine, triazine, oxazine, oxathiazin, oxadiazine, indole, benzimidazole, indoxazine, bisbenzoxazole, benzisoxazole, benzothiazole, quinoline, isoquinoline, cinnoline, quinazoline, quinoxaline, naphthalene, phthalein, pteridine, xanthene, acridine, phenazine, phenothiazine, phenoxazine, dibenzoselenophene, benzoselenophene, benzofuropyridine, indolocarbazole, pyridylindole, pyrrolodipyridine, furodipyridine, benzothienopyridine, thienodipyridine, benzoselenophenopyridine, and selenophenodipyridine; groups comprising 2 to 10 ring structures which may be the same or different types of cyclic aryl or aromatic heterocyclic group and are bonded to each other directly or through at least one of the following groups, for example: oxygen atom, nitrogen atom, sulfur atom, silicon atom, phosphorus atom, boron atom, chain structure unit, and aliphatic cyclic group; and wherein each Ar may be further optionally substituted, and the substituents may optionally be hydrogen, alkyl, alkoxy, amino, alkene, alkyne, aralkyl, heteroalkyl, aryl and heteroaryl.

In one aspect, $Ar^1$ to $Ar^9$ may be independently selected from the group consisting of:

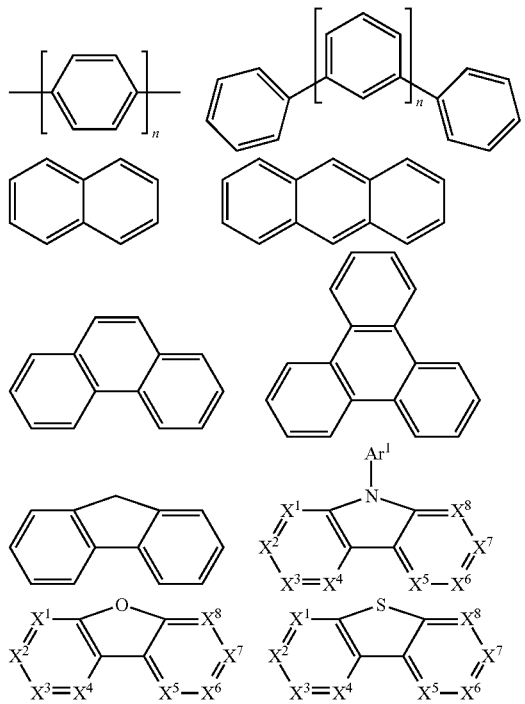

wherein n is an integer of 1 to 20; $X^1$ to $X^8$ are CH or N; $Ar^1$ is as defined above.

Additional non-limiting examples of cyclic aryl amine-derived compounds may be found in U.S. Pat. Nos. 3,567,450, 4,720,432, 5,061,569, 3,615,404, and 5,061,569.

Examples of metal complexes that may be used as HTM or HIM include, but are not limited to, the general structure as follows:

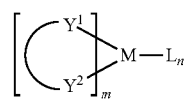

wherein M may be a metal having an atomic weight greater than 40; and $(Y^1-Y^2)$ is a bidentate ligand, wherein $Y^1$ and $Y^2$ are independently selected from C, N, O, P, and S; L is an auxiliary ligand; m is an integer from 1 to the maximum coordination number of the metal; m+n is the maximum coordination number of the metal.

In one embodiment, $(Y^1-Y^2)$ may be a 2-phenylpyridine derivative.

In another embodiment, $(Y^1-Y^2)$ may be a carbene ligand.

In another embodiment, M may be selected from Ir, Pt, Os, and Zn.

In another aspect, the HOMO of the metal complex is greater than −5.5 eV (relative to the vacuum level).

Suitable examples of HIM/HTM compounds are set forth in the following table:

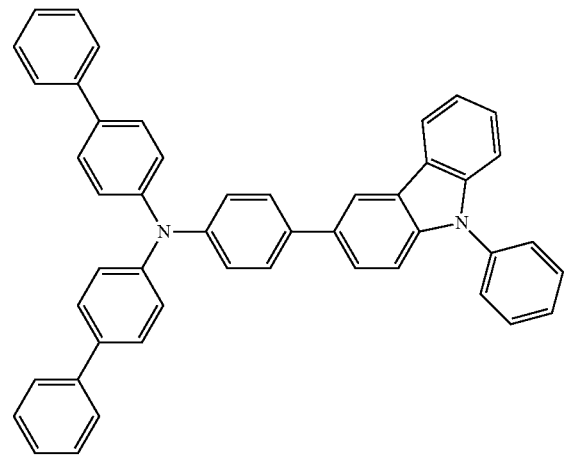

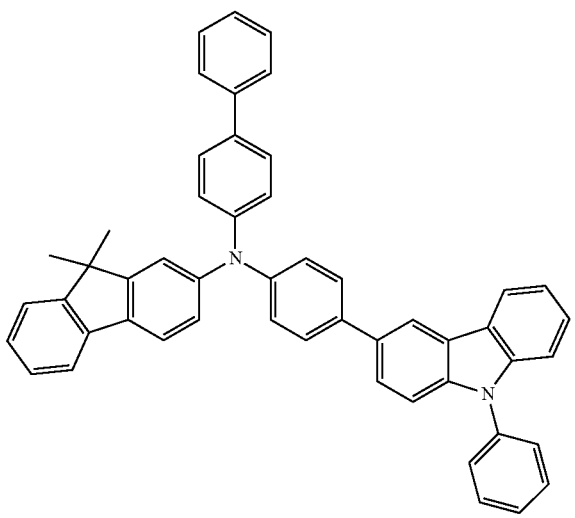

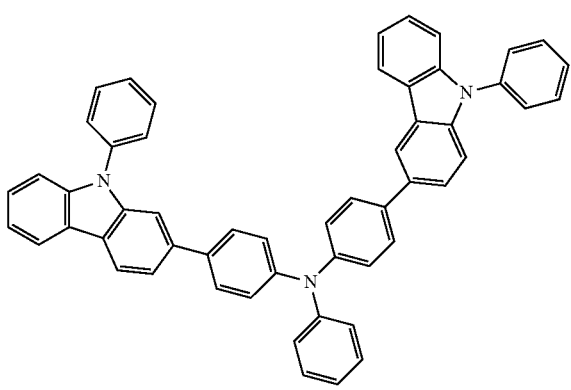

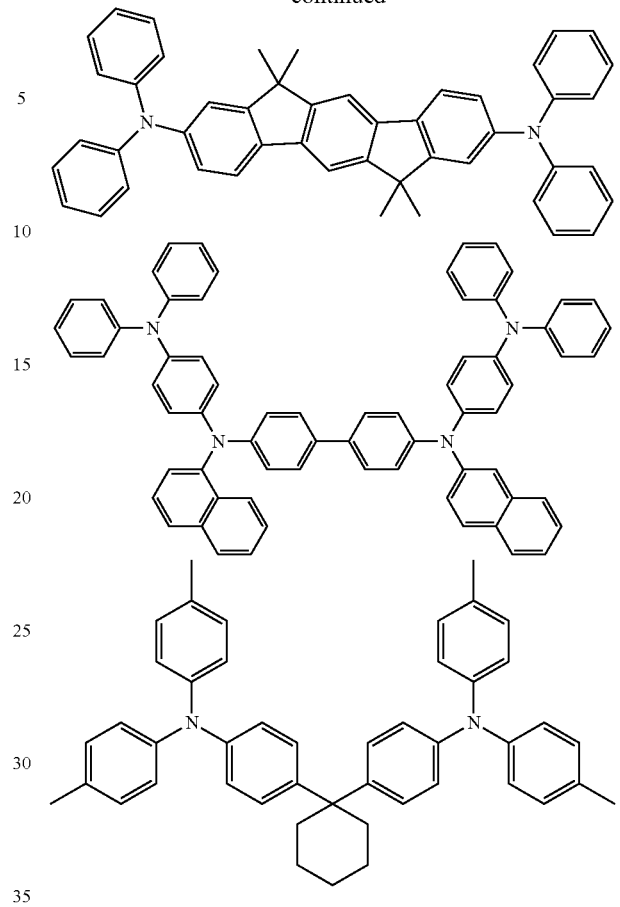

-continued

2. Triplet Host

Examples of a triplet host material used are not particularly limited and any metal complex or organic compound may be used as the host material as long as its triplet energy is greater than that of the light emitter, especially a triplet emitter or phosphorescent emitter.

Examples of metal complexes that may be used as triplet hosts may include, but are not limited to, the general structure as follows:

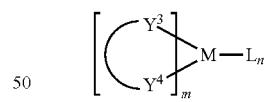

wherein M may be a metal; $(Y^3-Y^4)$ may be a bidentate ligand, $Y^3$ and $Y^4$ may be independently selected from C, N, O, P, and S; L may be an auxiliary ligand; m may be an integer with the value from 1 to the maximum coordination number of the metal; and, m+n is the maximum number of coordination of the metal.

In a preferred embodiment, the metal complex which may be used as the triplet host has the following form:

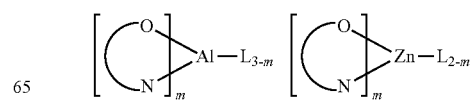

(O—N) may be a bidentate ligand in which the metal is coordinated to O and N atoms.

In one embodiment, M may be selected from Ir and Pt.

Examples of organic compounds that may be used as triplet host are selected from: compounds comprising cyclic aryl groups, such as benzene, biphenyl, triphenyl, benzo, and fluorene; compounds comprising aromatic heterocyclic groups, such as triphenylamine, dibenzothiophene, dibenzofuran, dibenzoselenophen, furan, thiophene, benzofuran, benzothiophene, benzoselenophene, carbazole, indolocarbazole, indolopyridine, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazin, oxadiazine, indole, benzimidazole, indoxazine, bisbenzoxazole, isoxazole, benzothiazole, quinoline, isoquinoline, cinnoline, quinazoline, quinoxaline, naphthalene, phthalein, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, or a combination thereof; and groups comprising 2 to 10 ring structures, which may be the same or different types of cyclic aryl or aromatic heterocyclic group and are linked to each other directly or by at least one of the following groups, such as oxygen atom, nitrogen atom, sulfur atom, silicon atom, phosphorus atom, boron atom, chain structure unit, and aliphatic ring, wherein each Ar may be further optionally substituted and the substituents may be any one of hydrogen, alkyl, alkoxy, amino, alkene, alkyne, aralkyl, heteroalkyl, aryl and heteroaryl, or a combination thereof.

In a preferred embodiment, the triplet host material may be selected from compounds comprising at least one of the following groups:

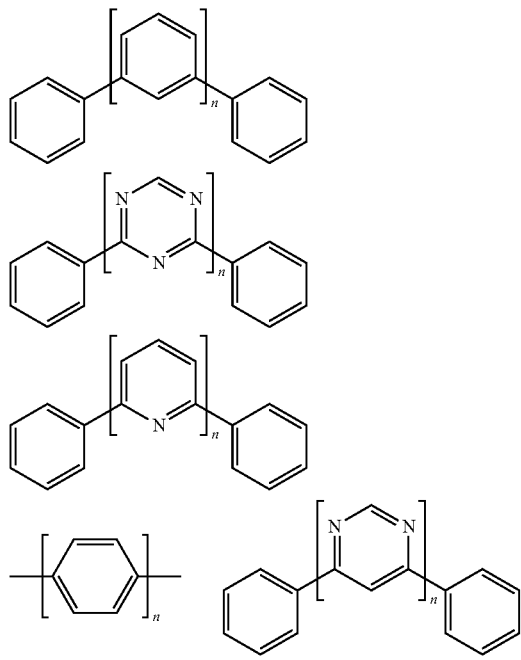

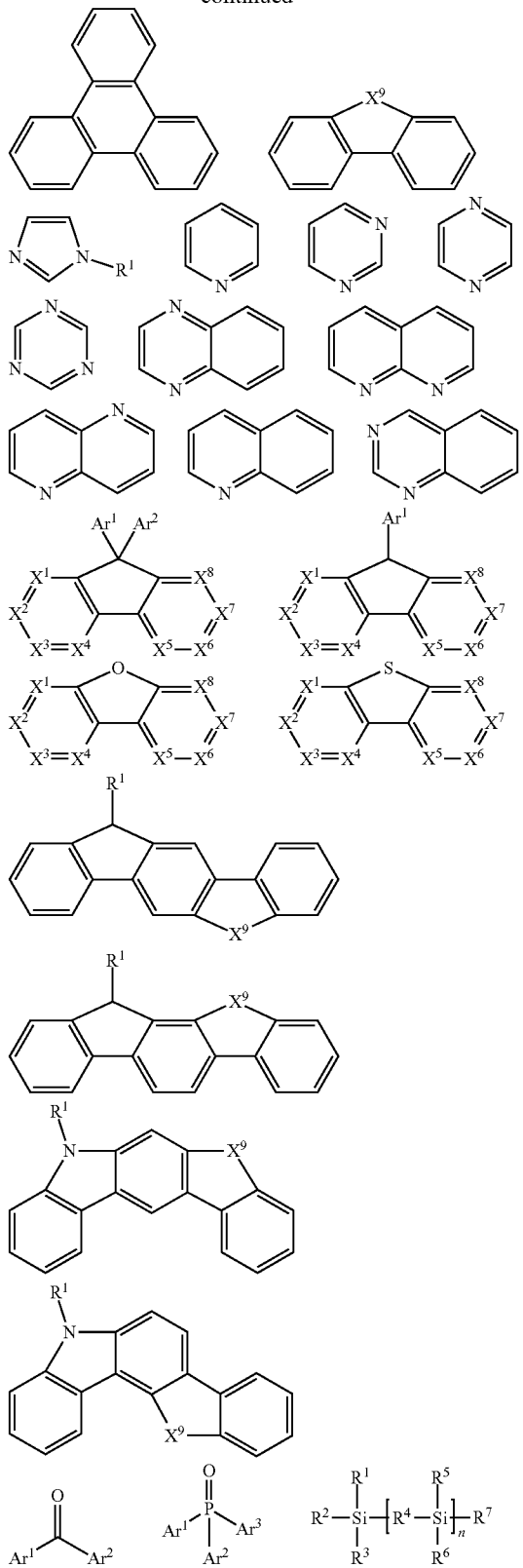

wherein $R^1$-$R^7$ each may be independently selected from the following groups: hydrogen, alkyl, alkoxy, amino, alkene, alkyne, aralkyl, heteroalkyl, aryl and heteroaryl; wherein, when they are aryl or heteroaryl, they have the same meaning as $Ar^1$ and $Ar^2$ above; n is an integer from 0 to 20; $X^1$-$X^8$ are selected from CH or N; and $X^9$ is selected from $CR^1R^2$ or $NR^1$.

Examples of suitable triplet host material are listed in the following table:

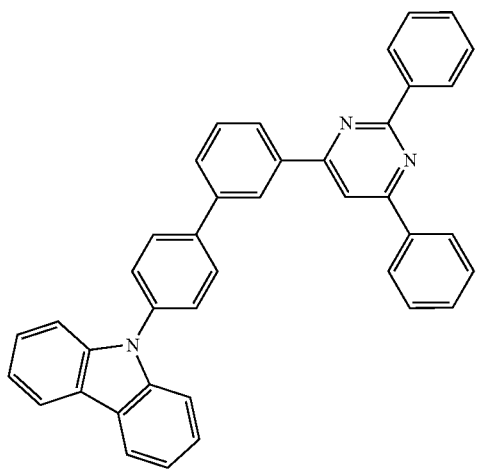

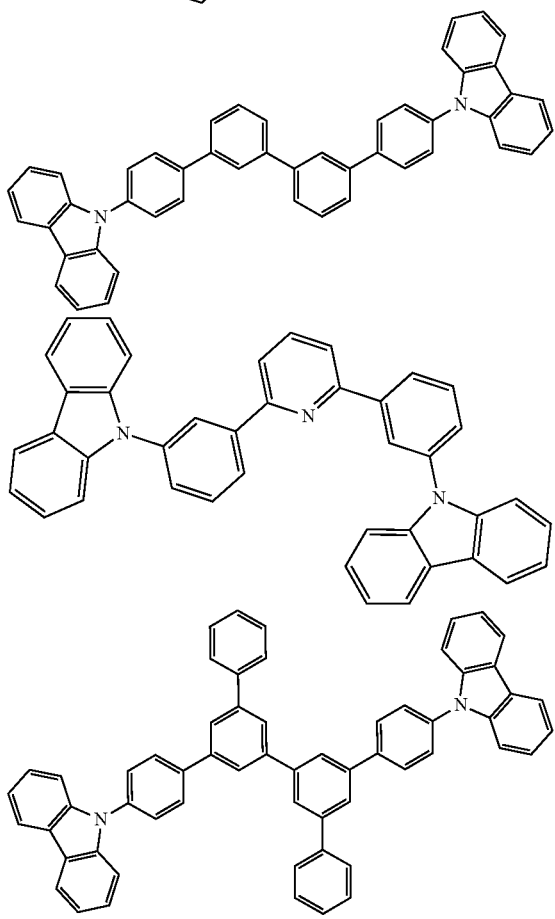

3. Singlet Host

Examples of singlet host material used are not particularly limited and any organic compound may be used as the host as long as its singlet state energy is greater than that of the light emitter, especially the singlet emitter or fluorescent light emitter.

Non-limiting examples of organic compounds used as singlet host materials may be selected from: cyclic aryl compounds, such as benzene, biphenyl, triphenyl, benzo, naphthalene, anthracene, phenalene, phenanthrene, fluorene, pyrene, chrysene, perylene, azulene; aromatic heterocyclic compounds, such as triphenylamine, dibenzothiophene, dibenzofuran, dibenzoselenophen, furan, thiophene, benzofuran, benzothiophene, benzoselenophene, carbazole, indolocarbazole, indolopyridine, pyrrolodipyridine, pyrazole, imidazole, triazole, isoxazole, thiazole, oxadiazole, oxatriazole, dioxazole, thiadiazole, pyridine, pyridazine, pyrimidine, pyrazine, triazine, oxazine, oxathiazin, oxadiazine, indole, benzimidazole, indoxazine, bisbenzoxazole, isoxazole, benzothiazole, quinoline, isoquinoline, cinnoline, quinazoline, quinoxaline, naphthalene, phthalein, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and groups comprising 2 to 10 ring structures, which may be the same or different types of cyclic aryl or aromatic heterocyclic group and are linked to each other directly or by at least one of the following groups, such as oxygen atom, nitrogen atom, sulfur atom, silicon atom, phosphorus atom, boron atom, chain structure unit, and aliphatic rings.

In a preferred embodiment, the monomorphic host material may be selected from compounds comprising at least one of the following groups:

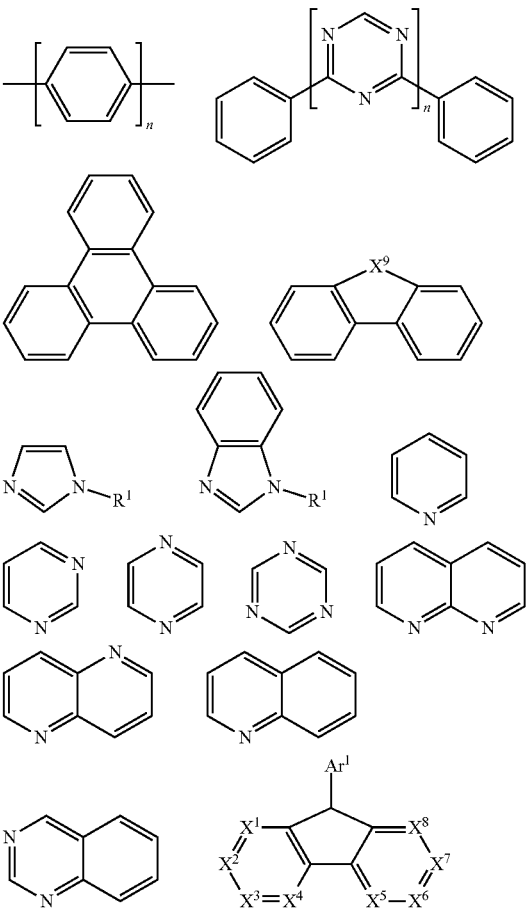

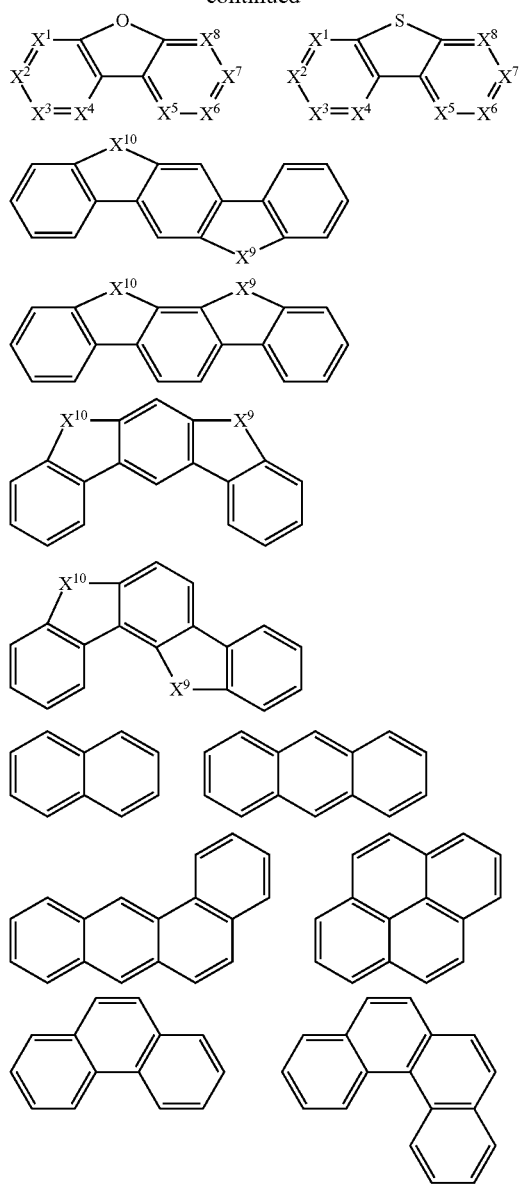

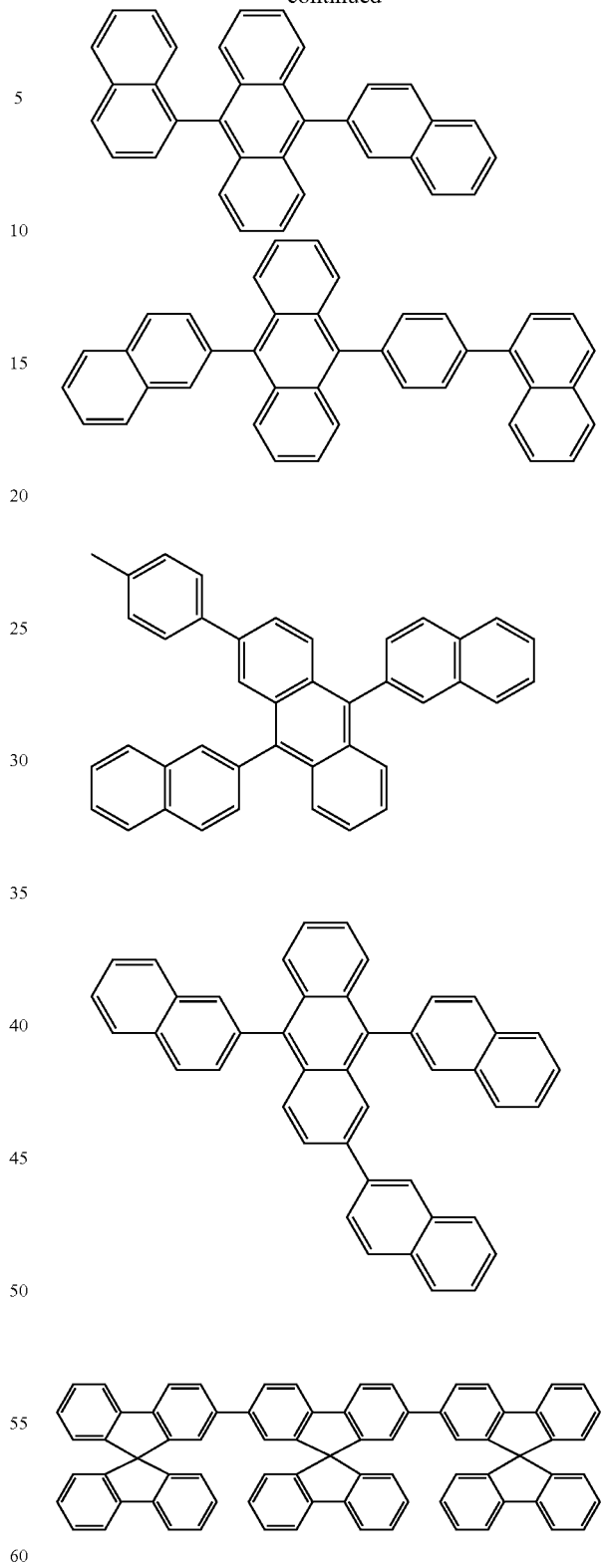

wherein $R^1$ may be independently selected from the following groups: hydrogen, alkyl, alkoxy, amino, alkene, alkyne, aralkyl, heteroalkyl, aryl and heteroaryl; $Ar^1$ is an aryl or heteroaryl and has the same meaning as $Ar^1$ in HTM above; n is an integer from 0 to 20; $X^1$-$X^8$ are selected from CH or N; and $X^9$ and $X^{10}$ are selected from $CR^1R^2$ or $NR^1$.

Examples of suitable anthryl-based singlet host material are listed in the following table:

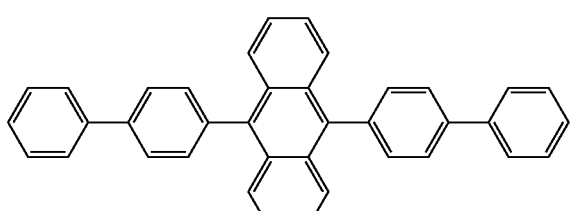

4. Singlet Emitter

The singlet emitter tends to have a longer conjugate π-electron system. To date, there have been many examples, such as, tyrylamine and its derivatives disclosed in JP2913116B and WO2001021729A1, and indenofluorene and its derivatives disclosed in WO2008/006449 and WO2007/140847.

In a preferred embodiment, the singlet emitter may be selected from the group consisting of monostyrylamines, distyrylamines, tristyrylamines, tetrastyrylamines, styrylphosphines, styryl ethers, and arylamines, or combinations thereof.

Mono styrylamine refers to a compound which comprises an unsubstituted or optionally substituted styryl group and at least one amine, most preferably an aryl amine. Distyrylamine refers to a compound comprising two unsubstituted or optionally substituted styryl groups and at least one amine, most preferably an aryl amine. Temarystyrylamine refers to a compound which comprises three unsubstituted or optionally substituted styryl groups and at least one amine, most preferably an aryl amine. Quatemarystyrylamine refers to a compound comprising four unsubstituted or optionally substituted styryl groups and at least one amine, most preferably an aryl amine. Preferred styrene is stilbene, which may be further optionally substituted. The corresponding phosphines and ethers are defined similarly to amines. Aryl amine or aryl amine refers to a compound comprising three unsubstituted or optionally substituted cyclic or heterocyclic aryl systems directly attached to nitrogen. At least one of these cyclic or heterocyclic aryl systems is preferably selected from fused ring systems and most preferably has at least 14 aromatic ring atoms. Among the preferred examples are aryl anthramine, aryl anthradiamine, aryl pyrene amines, aryl pyrene diamines, aryl chrysene amines and aryl chrysene diamine. Aryl anthramine refers to a compound in which a diarylamino group is directly attached to anthracene, most preferably at position 9. Aryl anthradiamine refers to a compound in which two diarylamino groups are directly attached to anthracene, most preferably at positions 9, 10. Aryl pyrene amines, aryl pyrene diamines, aryl chrysene amines and aryl chrysene diamine are similarly defined, wherein the diarylarylamino group is most preferably attached to position 1 or 1 and 6 of pyrene.

Examples of singlet emitter based on vinylamine and arylamine are also preferred examples which may be found in the following patent documents: WO 2006/000388, WO 2006/058737, WO 2006/000389, WO 2007/065549, WO 2007/115610, U.S. Pat. No. 7,250,532 B2, DE 102005058557 A1, CN 1583691 A, JP 08053397 A, U.S. Pat. No. 6,251,531 B1, US 2006/210830 A, EP 1957606 A1, and US 2008/0113101 A1. The entire contents of the above listed patent documents are hereby incorporated by reference.

Examples of singlet light emitters based on distyrylbenzene and its derivatives may be found in, for example, U.S. Pat. No. 5,121,029.

Further preferred singlet emitters may be selected from the group consisting of: indenofluorene-amine and indenofluorene-diamine as disclosed in WO 2006/122630, benzoindenofluorene-amine and benzoindenofluorene-diamine as disclosed in WO 2008/006449, dibenzoindenofluorene-amine and dibenzoindenofluorene-diamine as disclosed in WO2007/140847.

Other materials useful as singlet emitters include polycyclic aryl compounds, especially any one selected from the derivatives of the following compounds: anthracenes such as 9,10-di-naphthylanthracene, naphthalene, tetraphenyl, phenanthrene, perylene such as 2,5,8,11-tetra-t-butylatedylene, indenoperylene, phenylenes such as 4,4'-(bis (9-ethyl-3-carbazovinylene)-1,1'-biphenyl, periflanthene, decacyclene, coronene, fluorene, spirobifluorene, arylpyren (e.g., US20060222886), arylenevinylene (e.g., U.S. Pat. Nos. 5,121,029, 5,130,603), cyclopentadiene such as tetraphenylcyclopentadiene, rubrene, coumarine, rhodamine, quinacridone, pyrane such as 4 (dicyanoethylene)-6-(4-dimethylaminostyryl-2-methyl)-4H-pyrane (DCM), thiapyran, bis (azinyl) imine-boron compounds (US 2007/0092753 A1), bis (azinyl) methene compounds, carbostyryl compounds, oxazone, benzoxazole, benzothiazole, benzimidazole, and diketopyrrolopyrrole, or combinations thereof. Non-limiting examples of some singlet emitter material may be found in the following patent documents: US 20070252517 A1, U.S. Pat. Nos. 4,769,292, 6,020,078, US 2007/0252517 A1, and US 2007/0252517 A1. The entire contents of the above listed patent documents are hereby incorporated by reference.

Examples of suitable singlet emitters are listed in the following table:

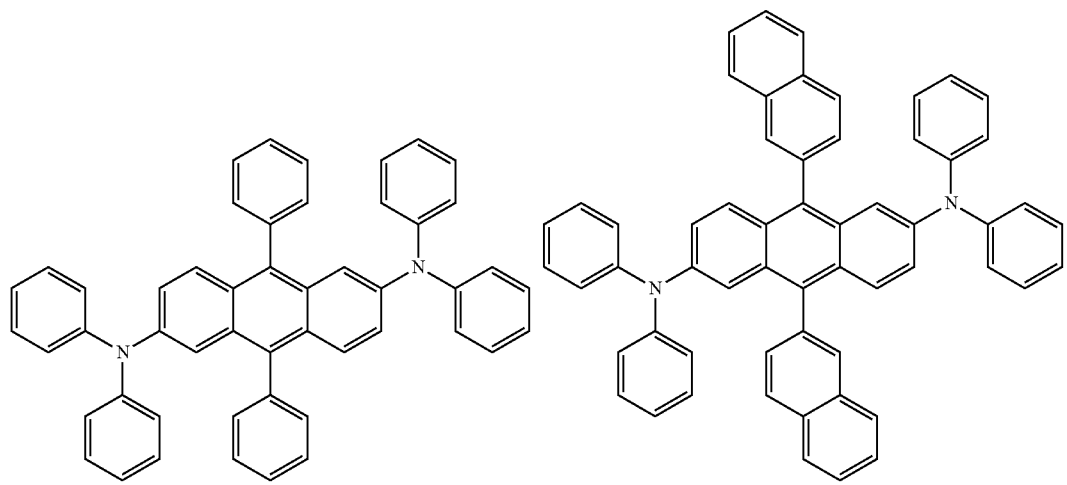

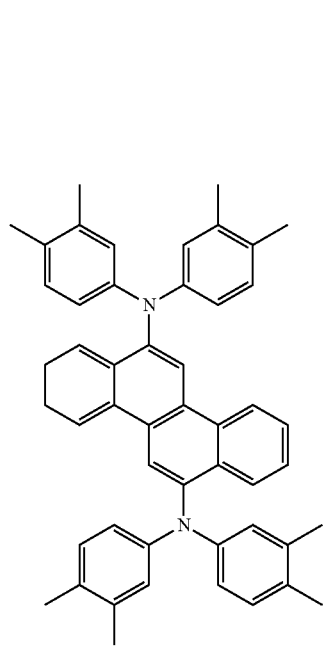
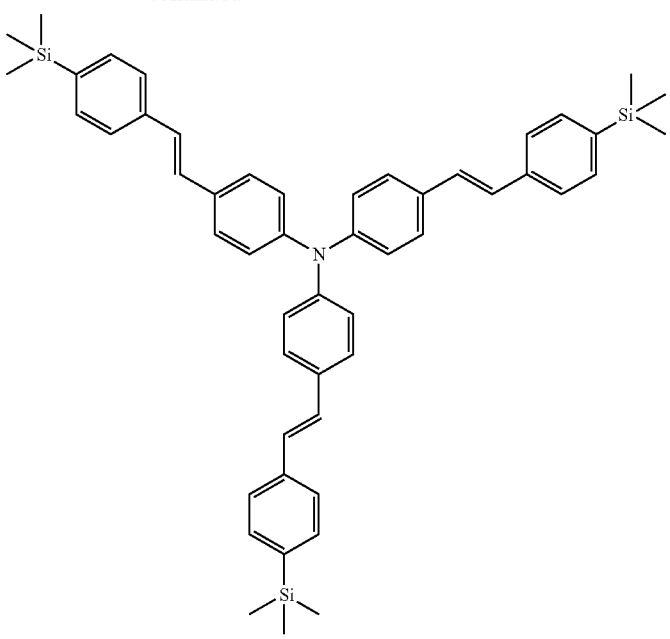
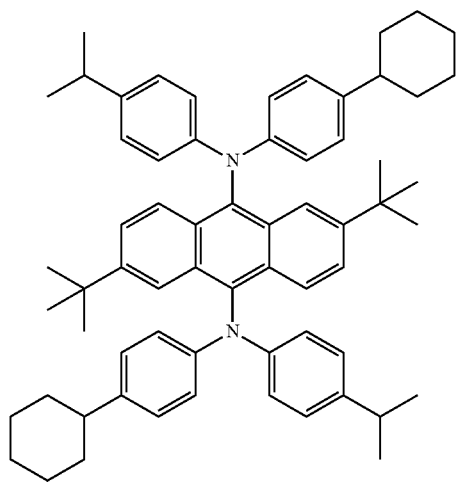
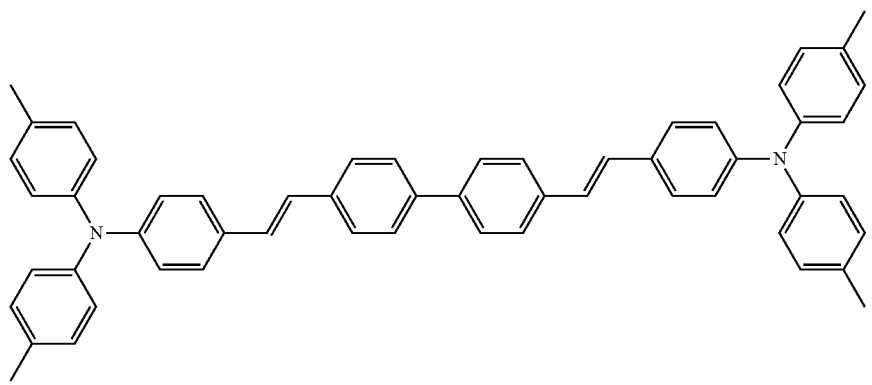

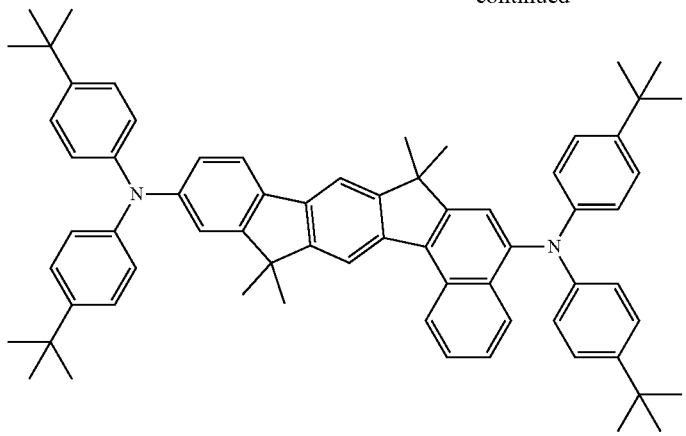

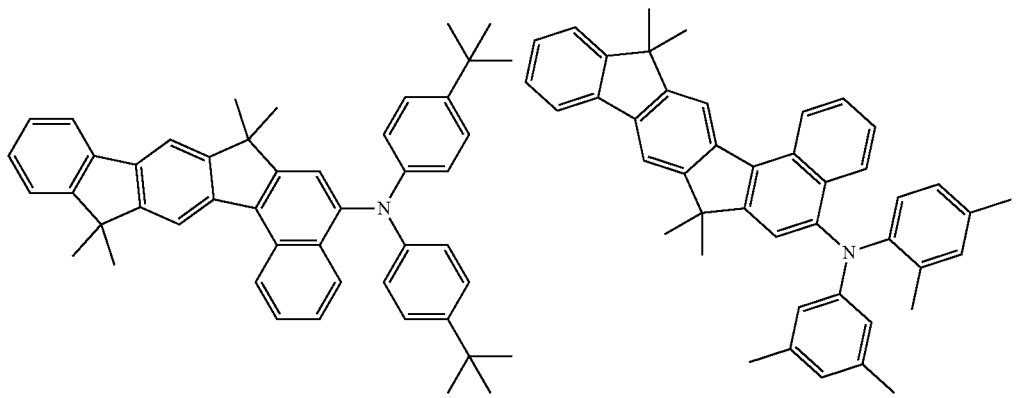

5. Thermally Activated Delayed Fluorescent Material (TADF):

Traditional organic fluorescent materials can only emit light using 25% singlet excitonic luminescenceformed by electrical excitation, and the devices have relatively low internal quantum efficiency (up to 25%). The phosphorescent material enhances the intersystem crossing due to the strong spin-orbit coupling of the heavy atom center, the singlet exciton and the triplet exciton luminescence formed by the electric excitation can be effectively utilized, so that the internal quantum efficiency of the device can reach 100%. However, the phosphor materials are expensive, the material stability is poor, and the device efficiency roll-off is a serious problem, which limit its application in OLED. Thermally-activated delayed fluorescent materials are the third generation of organic light-emitting materials developed after organic fluorescent materials and organic phosphorescent materials. This type of material generally has a small singlet-triplet energy level difference (ΔEst), and triplet excitons can be converted to singlet excitons by intersystem crossing. This can make full use of the singlet excitons and triplet excitons formed under electric excitation. The device can achieve 100% quantum efficiency.

The TADF material needs to have a small singlet-triplet energy level difference, typically ΔEst<0.3 eV, preferably ΔEst<0.2 eV, more preferably ΔEst<0.1 eV, and most preferably ΔEst<0.05 eV. In a preferred embodiment, TADF has good fluorescence quantum efficiency. Some TADF emitting materials can be found in the following patent documents: CN103483332(A), TW201309696(A), TW201309778(A), TW201343874(A), TW201350558(A), US20120217869 (A1), WO2013133359(A1), WO2013154064 (A1), Adachi, et.al. Adv. Mater., 21, 2009, 4802, Adachi, et.al. Appl. Phys. Lett., 98, 2011, 083302, Adachi, et.al. Appl. Phys. Lett., 101, 2012, 093306, Adachi, et.al. Chem. Commun., 48, 2012, 11392, Adachi, et.al. Nature Photonics, 6, 2012, 253, Adachi, et.al. Nature, 492, 2012, 234, Adachi, et.al. J. Am. Chem. Soc, 134, 2012, 14706, Adachi, et.al. Angew. Chem. Int. Ed, 51, 2012, 11311, Adachi, et.al. Chem. Commun., 48, 2012, 9580, Adachi, et.al. Chem. Commun., 48, 2013, 10385, Adachi, et.al. Adv. Mater., 25, 2013, 3319, Adachi, et.al. Adv. Mater., 25, 2013, 3707, Adachi, et.al. Chem. Mater., 25, 2013, 3038, Adachi, et.al. Chem. Mater., 25, 2013, 3766, Adachi, et. Al. J. Mater. Chem. C., 1, 2013, 4599, Adachi, et.al. J. Phys. Chem. A., 117, 2013, 5607. The entire contents of the above listed patent or literature documents are hereby incorporated by reference.

Some examples of suitable TADF light-emitting materials are listed in the following table:

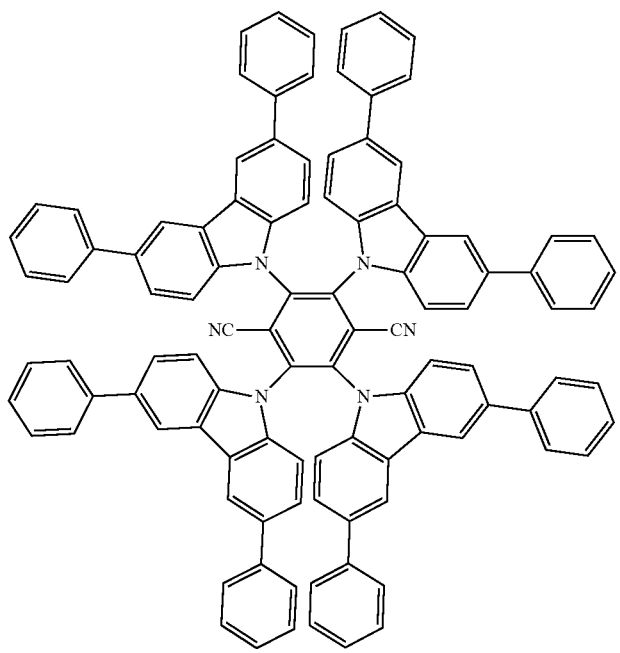 [SMILES: N#Cc1c(-n2c3ccc(-c4ccccc4)cc3c3cc(-c4ccccc4)ccc32)c(-n2c3ccc(-c4ccccc4)cc3c3cc(-c4ccccc4)ccc32)c(C#N)c(-n2c3ccc(-c4ccccc4)cc3c3cc(-c4ccccc4)ccc32)c1-n1c2ccc(-c3ccccc3)cc2c2cc(-c3ccccc3)ccc21]
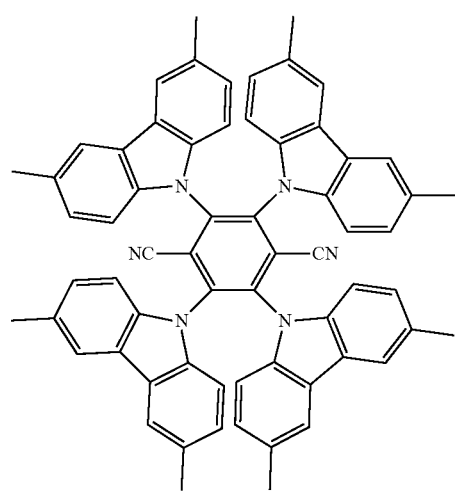

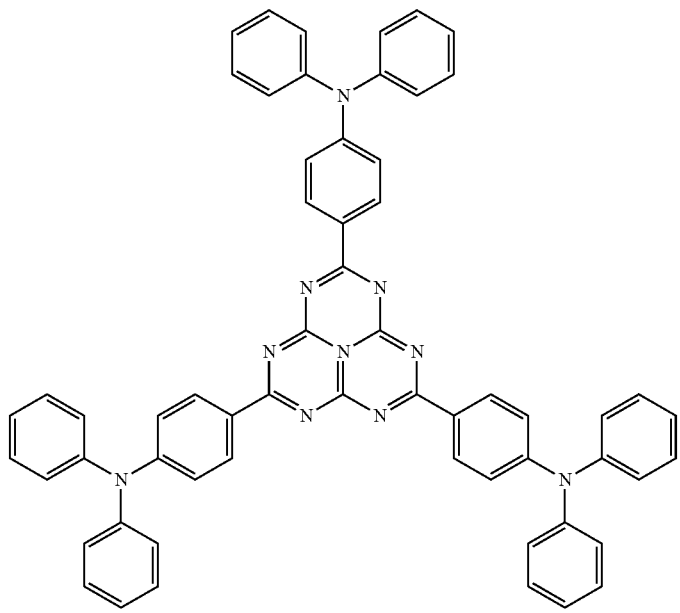
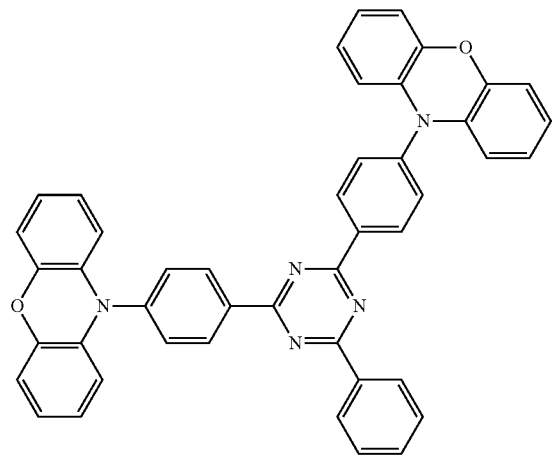 [SMILES: c1ccc(-c2nc(-c3ccc(N4c5ccccc5Oc5ccccc54)cc3)nc(-c3ccc(N4c5ccccc5Oc5ccccc54)cc3)n2)cc1]
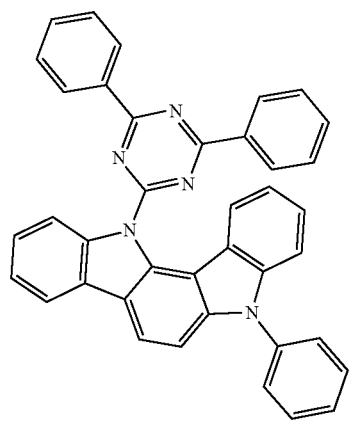 [SMILES: c1ccc(-c2nc(-c3ccccc3)nc(-n3c4ccccc4c4ccc5c(c6ccccc6n5-c5ccccc5)c43)n2)cc1]

-continued
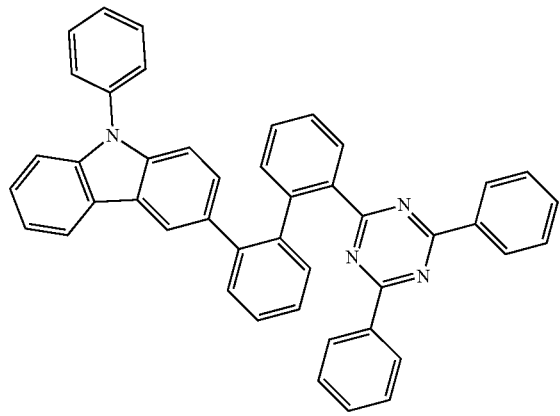 [SMILES: c1ccc(-c2nc(-c3ccccc3)nc(-c3ccccc3-c3ccccc3-c3ccc4c(c3)c3ccccc3n4-c3ccccc3)n2)cc1]
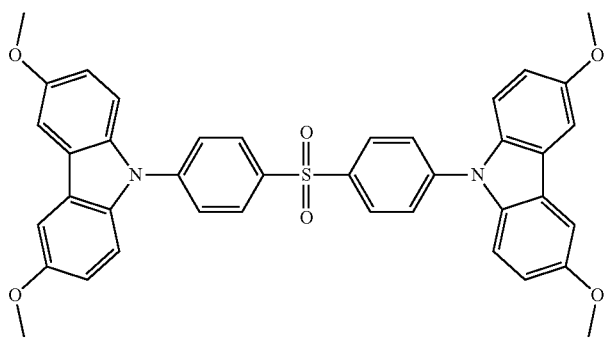 [SMILES: COc1ccc2c(c1)c1cc(OC)ccc1n2-c1ccc(S(=O)(=O)c2ccc(-n3c4ccc(OC)cc4c4cc(OC)ccc43)cc2)cc1]
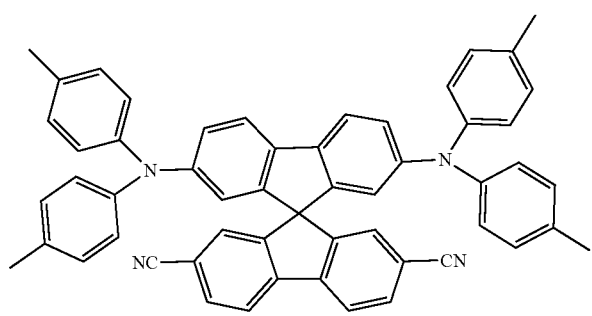
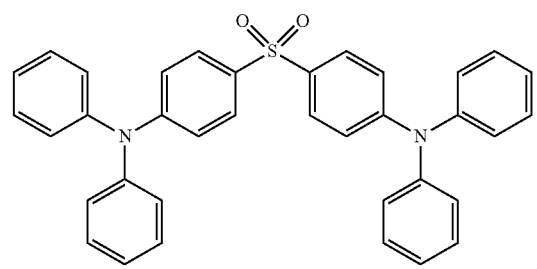 [SMILES: O=S(=O)(c1ccc(N(c2ccccc2)c2ccccc2)cc1)c1ccc(N(c2ccccc2)c2ccccc2)cc1]

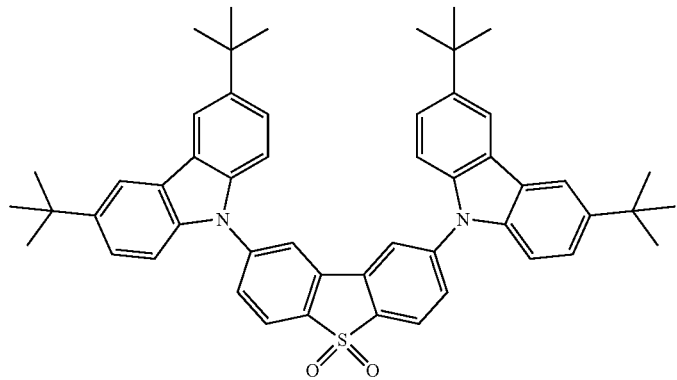 [SMILES: CC(C)(C)c1ccc2c(c1)c1cc(C(C)(C)C)ccc1n2-c1ccc2c(c1)-c1cc(-n3c4ccc(C(C)(C)C)cc4c4cc(C(C)(C)C)ccc43)ccc1S2(=O)=O]
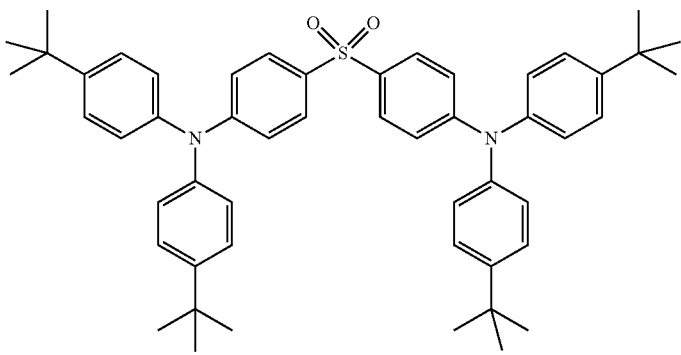 [SMILES: CC(C)(C)c1ccc(N(c2ccc(C(C)(C)C)cc2)c2ccc(S(=O)(=O)c3ccc(N(c4ccc(C(C)(C)C)cc4)c4ccc(C(C)(C)C)cc4)cc3)cc2)cc1]
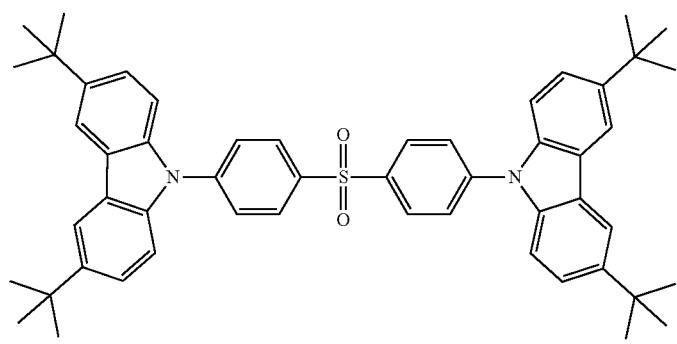 [SMILES: CC(C)(C)c1ccc2c(c1)c1cc(C(C)(C)C)ccc1n2-c1ccc(S(=O)(=O)c2ccc(-n3c4ccc(C(C)(C)C)cc4c4cc(C(C)(C)C)ccc43)cc2)cc1]
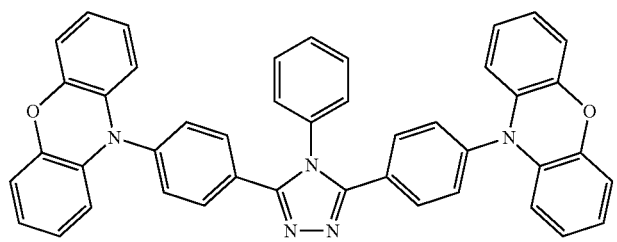 [SMILES: c1ccc(-n2c(-c3ccc(N4c5ccccc5Oc5ccccc54)cc3)nnc2-c2ccc(N3c4ccccc4Oc4ccccc43)cc2)cc1]

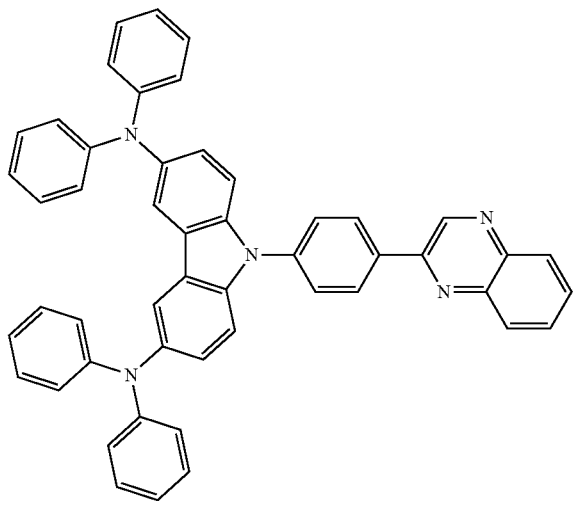 [SMILES: c1ccc(N(c2ccccc2)c2ccc3c(c2)c2cc(N(c4ccccc4)c4ccccc4)ccc2n3-c2ccc(-c3cnc4ccccc4n3)cc2)cc1]
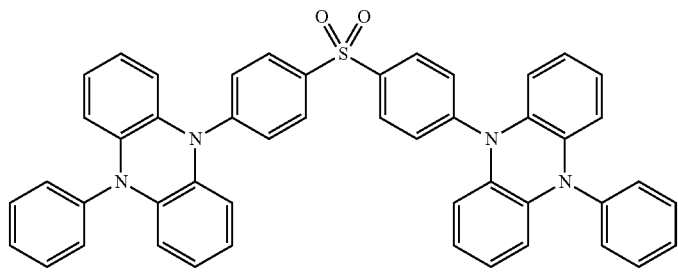 [SMILES: O=S(=O)(c1ccc(N2c3ccccc3N(c3ccccc3)c3ccccc32)cc1)c1ccc(N2c3ccccc3N(c3ccccc3)c3ccccc32)cc1]
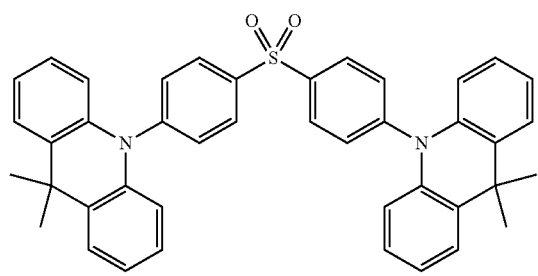
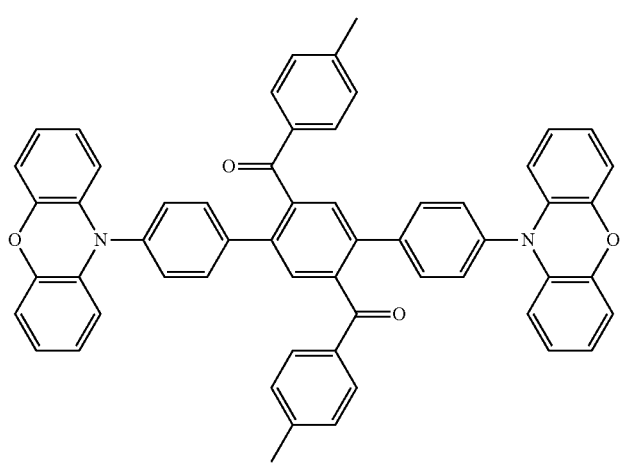 [SMILES: Cc1ccc(C(=O)c2cc(-c3ccc(N4c5ccccc5Oc5ccccc54)cc3)c(C(=O)c3ccc(C)cc3)cc2-c2ccc(N3c4ccccc4Oc4ccccc43)cc2)cc1]

-continued
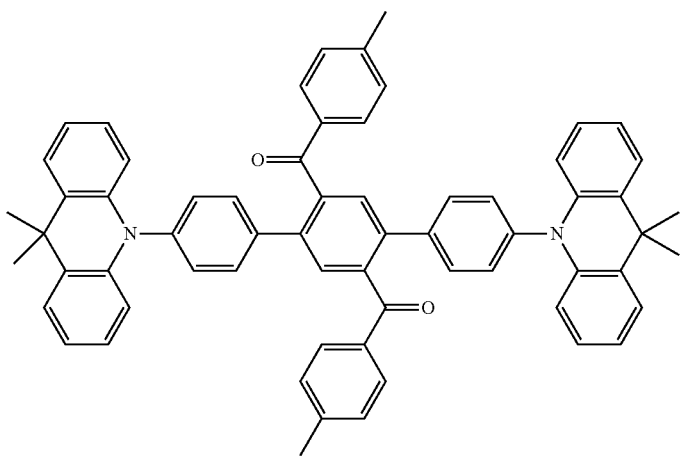
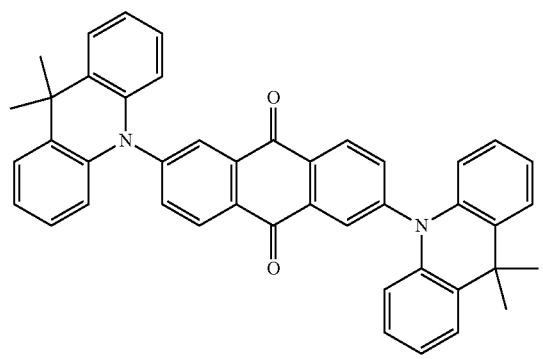
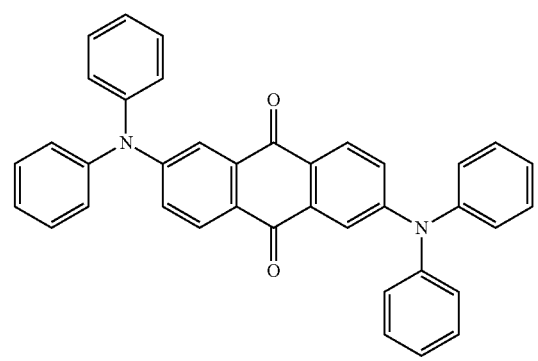 [SMILES: O=C1c2ccc(N(c3ccccc3)c3ccccc3)cc2C(=O)c2ccc(N(c3ccccc3)c3ccccc3)cc21]

-continued
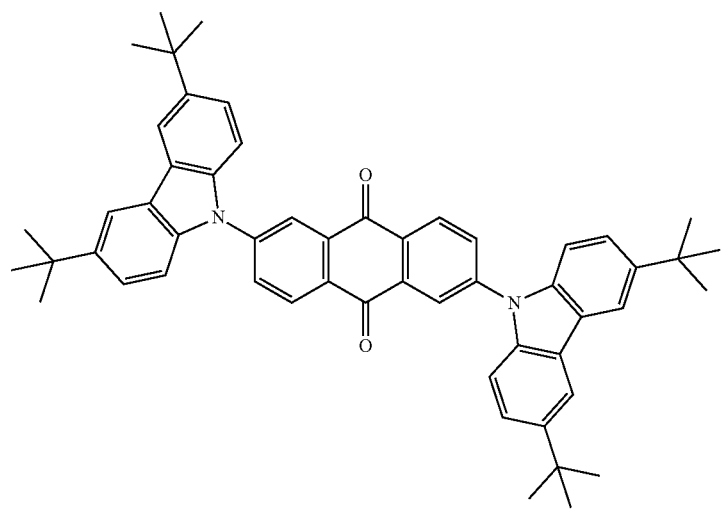 [SMILES: CC(C)(C)c1ccc2c(c1)c1cc(C(C)(C)C)ccc1n2-c1ccc2c(c1)C(=O)c1ccc(-n3c4ccc(C(C)(C)C)cc4c4cc(C(C)(C)C)ccc43)cc1C2=O]
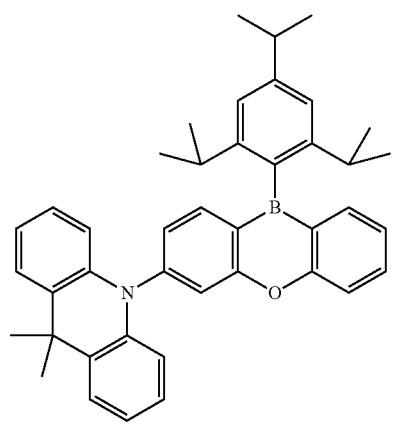 [SMILES: CC(C)c1cc(C(C)C)c(B2c3ccccc3Oc3cc(N4c5ccccc5C(C)(C)c5ccccc54)ccc32)c(C(C)C)c1]
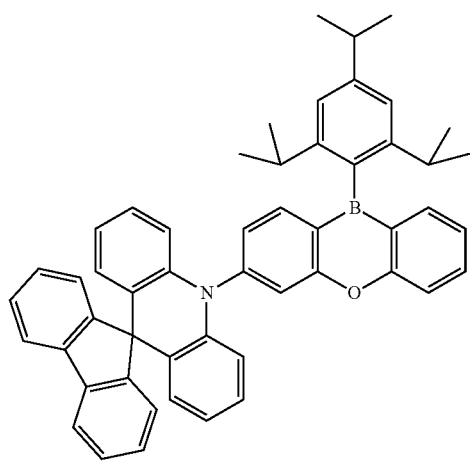 [SMILES: CC(C)c1cc(C(C)C)c(B2c3ccccc3Oc3cc(N4c5ccccc5C5(c6ccccc6-c6ccccc65)c5ccccc54)ccc32)c(C(C)C)c1]

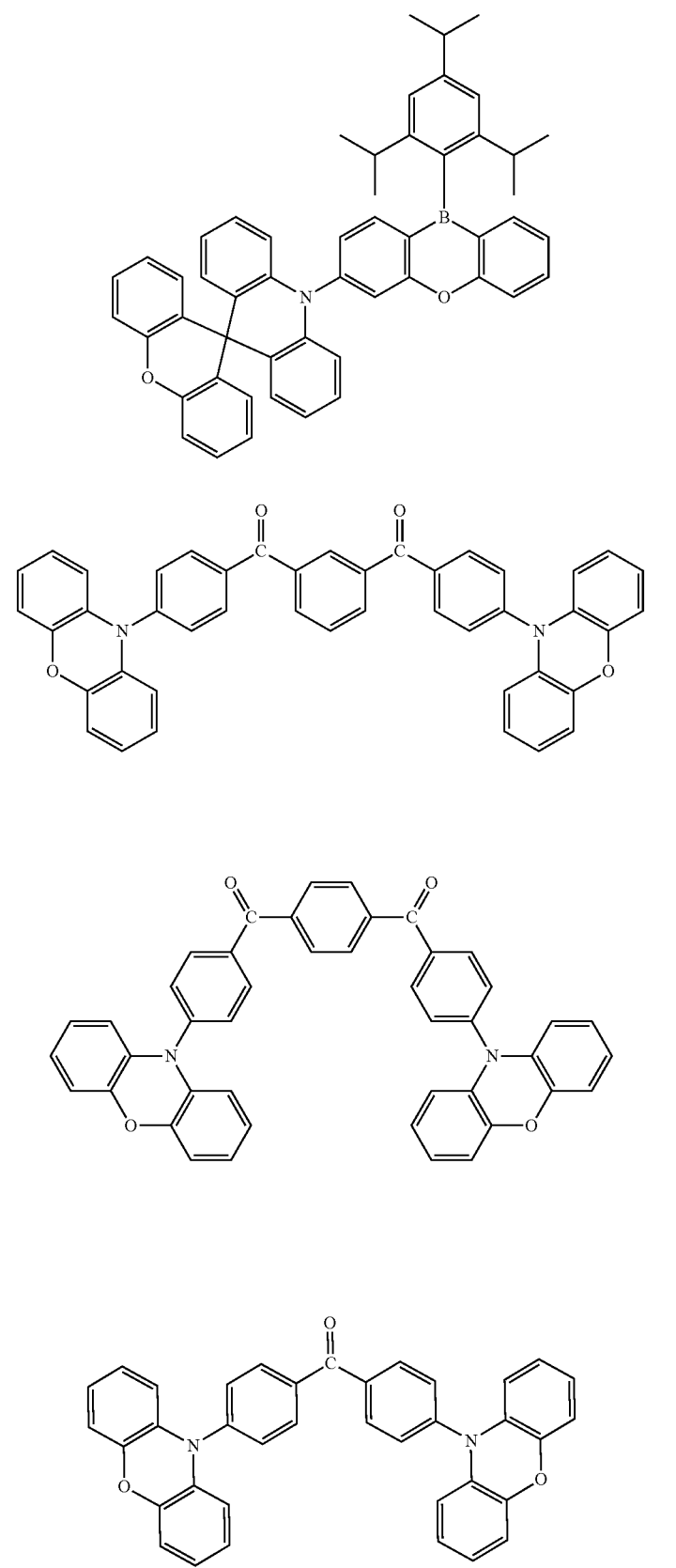

-continued
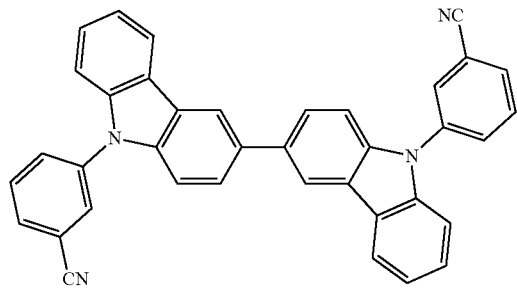 [SMILES: N#Cc1cccc(-n2c3ccccc3c3cc(-c4ccc5c(c4)c4ccccc4n5-c4cccc(C#N)c4)ccc32)c1]
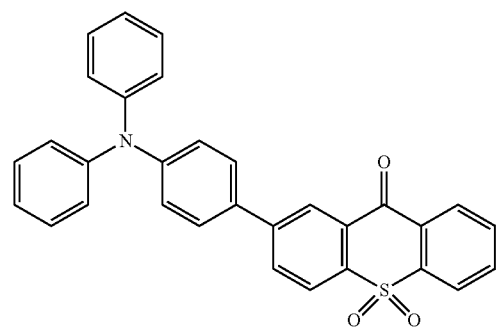 [SMILES: O=C1c2ccccc2S(=O)(=O)c2ccc(-c3ccc(N(c4ccccc4)c4ccccc4)cc3)cc21]
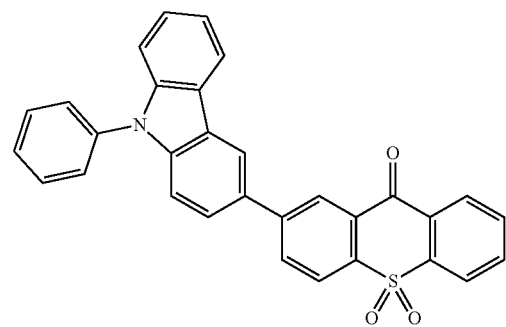 [SMILES: O=C1c2ccccc2S(=O)(=O)c2ccc(-c3ccc4c(c3)c3ccccc3n4-c3ccccc3)cc21]
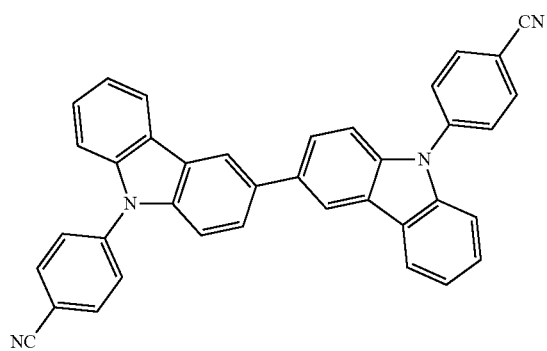 [SMILES: N#Cc1ccc(-n2c3ccccc3c3cc(-c4ccc5c(c4)c4ccccc4n5-c4ccc(C#N)cc4)ccc32)cc1]

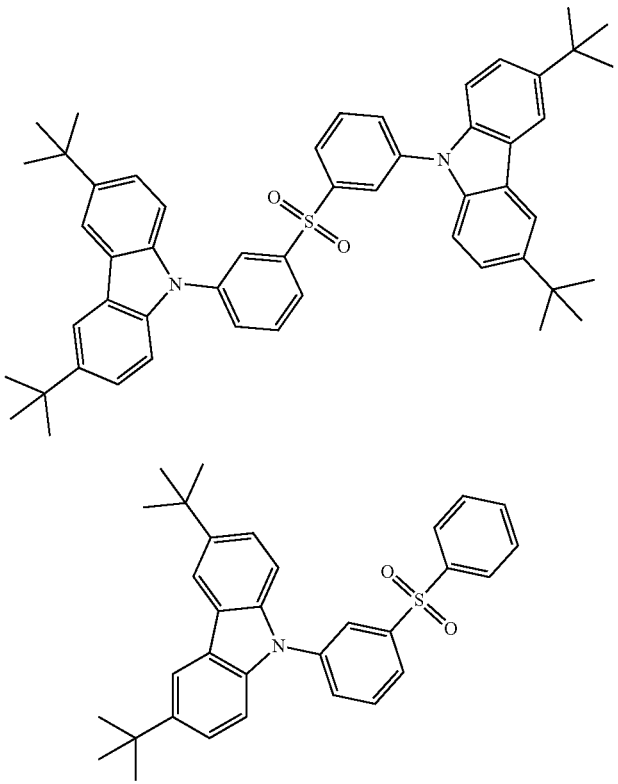

6. Triplet Emitter

The triplet emitter is also called a phosphorescent emitter. In a preferred embodiment, the triplet emitter may be a metal complex of the general formula M (L) n, wherein M may be a metal atom; L may be a same or different ligand each time it is present, and may be bonded or coordinated to the metal atom M at one or more positions; n may be an integer greater than 1, preferably 1, 2, 3, 4, 5 or 6. Alternatively, these metal complexes may be attached to a polymer by one or more positions, most preferably through an organic ligand.

In a preferred embodiment, the metal atom M may be selected from the group consisting of transition metal elements or lanthanides or actinides, preferably Ir, Pt, Pd, Au, Rh, Ru, Os, Sm, Eu, Gd, Tb, Dy, Re, Cu or Ag, and particularly preferably Os, Ir, Ru, Rh, Re, Pd, or Pt.

Preferably, the triplet emitter comprises a chelating ligand, i.e., a ligand, coordinated to the metal by at least two bonding sites, and it is particularly preferred that the triplet emitter comprises two or three identical or different bidentate or multidentate ligand. Chelating ligands help to improve stability of metal complexes.

Examples of organic ligands may be selected from the group consisting of phenylpyridine derivatives, 7,8-benzoquinoline derivatives, 2 (2-thienyl) pyridine derivatives, 2 (1-naphthyl) pyridine derivatives, or 2 phenylquinoline derivatives. All of these organic ligands may be optionally substituted, for example, optionally substituted with fluoromethyl or trifluoromethyl. The auxiliary ligand may be preferably selected from acetylacetonate or picric acid.

In a preferred embodiment, the metal complex which may be used as the triplet emitter may have the following form:

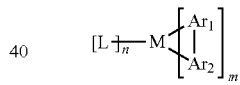

wherein M is a metal selected from the group consisting of transition metal elements or lanthanides or actinides;

$Ar^1$ may be the same or different cyclic group each time it is present, which comprises at least one donor atom, that is, an atom with a lone pair of electrons, such as nitrogen atom or phosphorus atom, which is coordinated to the metal through its ring group; $Ar^2$ may be the same or different cyclic group comprising at least one C atom and is coordinated to the metal through its ring group; $Ar^1$ and $Ar^2$ are covalently bonded together, wherein each of them may carry one or more substituents which may also be joined together by substituents; L may be the same or different at each occurrence and is an auxiliary ligand, preferably a bidentate chelating ligand, and most preferably a monoanionic bidentate chelating ligand; m is 1, 2 or 3, preferably 2 or 3, and particularly preferably 3; and, N is 0, 1, or 2, preferably 0 or 1, particularly preferably 0.

Examples of triplet emitter materials and examples of applications thereof may be found in the following patent documents and references: WO 200070655, WO 200141512, WO 200202714, WO 200215645, EP 1191613, EP 1191612, EP 1191614, WO 2005033244, WO 2005019373, US 2005/0258742, WO 2009146770, WO 2010015307, WO 2010031485, WO 2010054731, WO 2010054728, WO 2010086089, WO 2010099852, WO 2010102709, US 20070087219 A1, US 20090061681 A1, US 20010053462 A1, Baldo, Thompson et al. Nature 403, (2000), 750-753, US 20090061681 A1, US 20090061681 A1, Adachi et al. Appl. Phys. Lett. 78 (2001), 1622-1624, J. Kido et al. Appl. Phys. Lett. 65 (1994), 2124, Kido et al. Chem. Lett. 657, 1990, US 2007/0252517 A1, Johnson et al., JACS 105, 1983, 1795, Wrighton, JACS 96, 1974, 998, Ma et al., Synth. Metals 94, 1998, 245, U.S. Pat. Nos. 6,824,895, 7,029,766, 6,835,469, 6,830,828, US 20010053462 A1, WO 2007095118 A1, US 2012004407A1, WO 2012007088A1, WO2012007087A1, WO 2012007086A1, US 2008027220A1, WO 2011157339A1, CN 102282150A, and WO 2009118087A1. The entire contents of the above listed patent or literature documents are hereby incorporated by reference.

Examples of suitable triplet emitter are given in the following table:

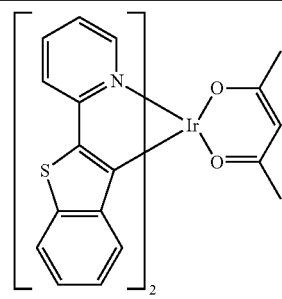

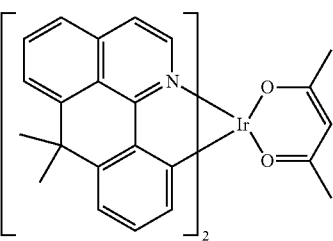

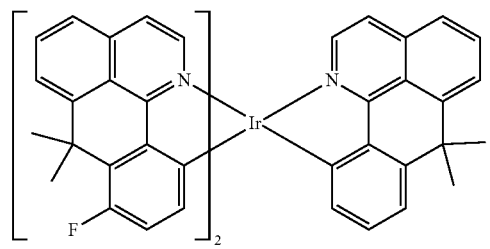

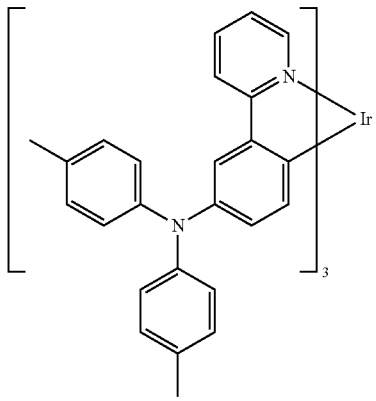

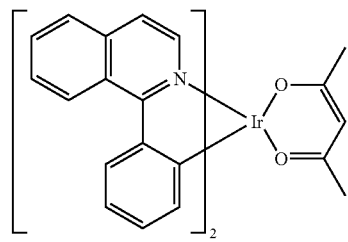

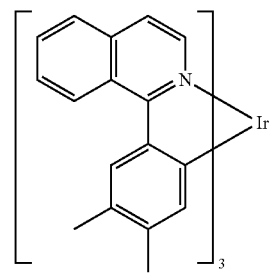

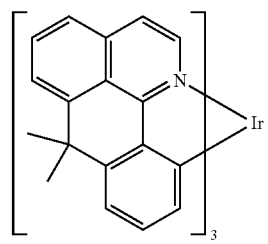

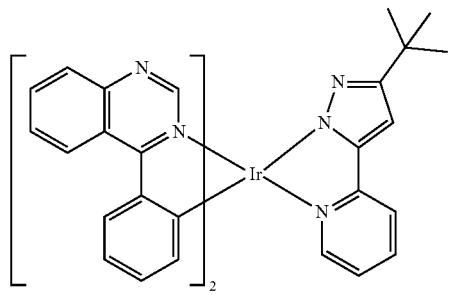

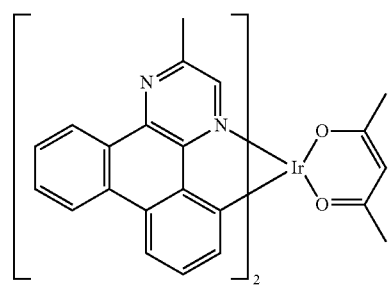

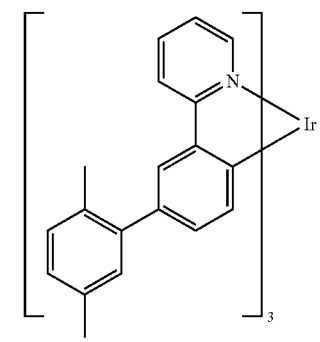
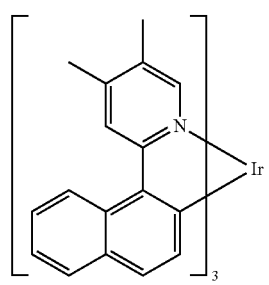
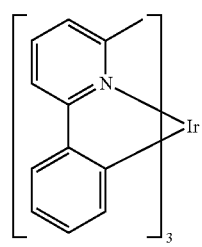
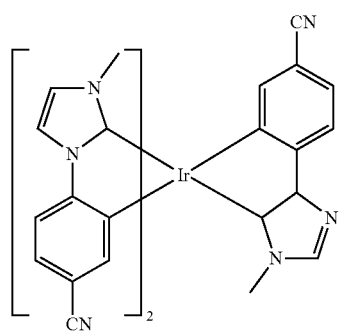
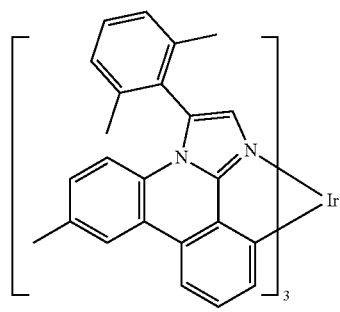
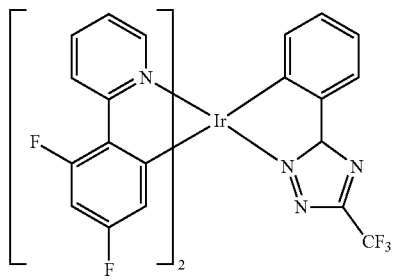
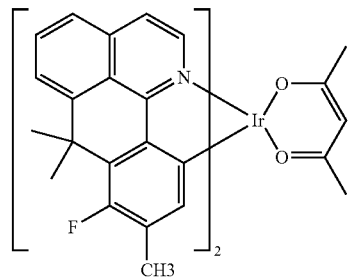
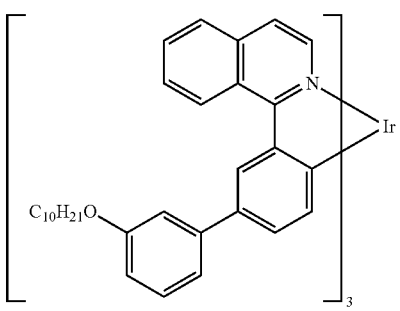
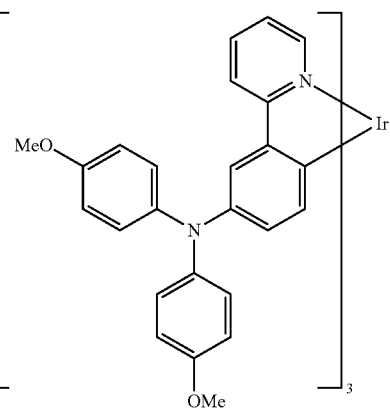
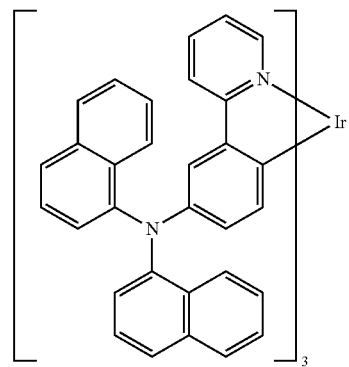

-continued
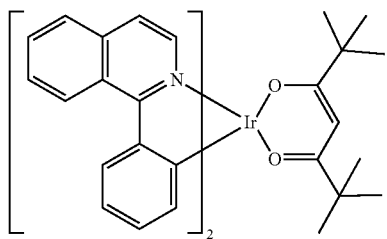
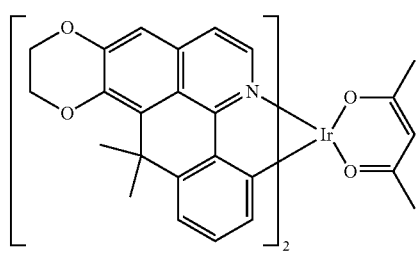
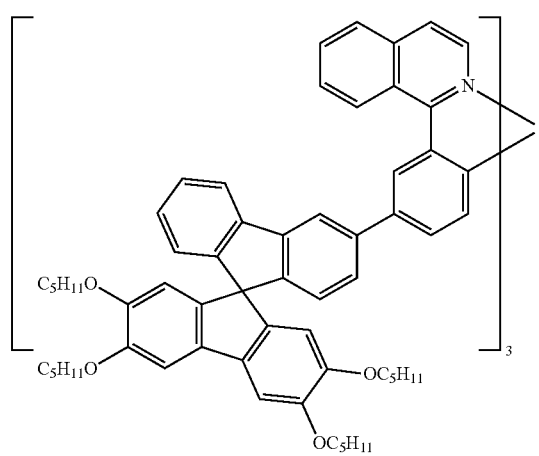
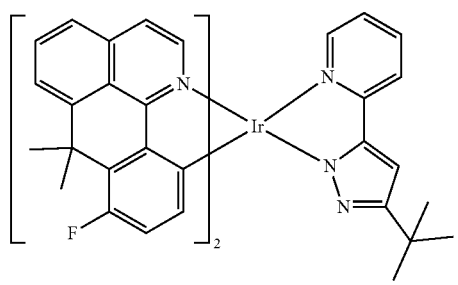
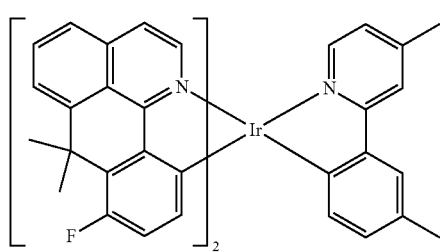
-continued
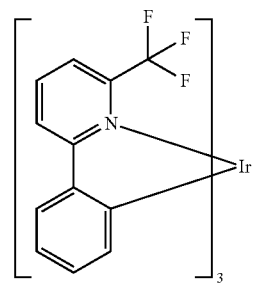
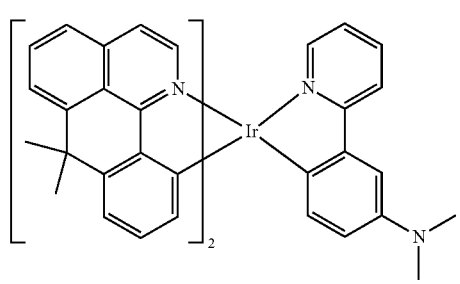
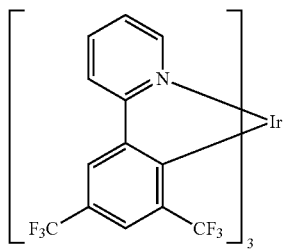
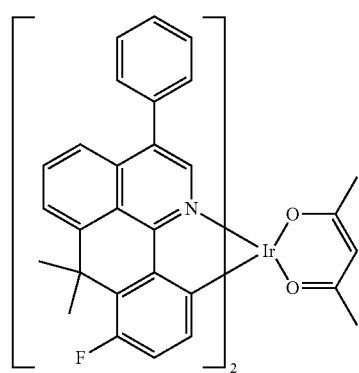

57
-continued
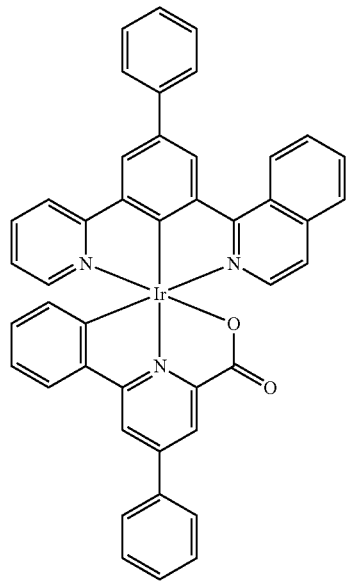
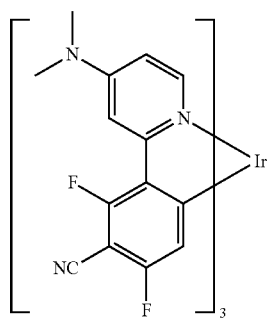
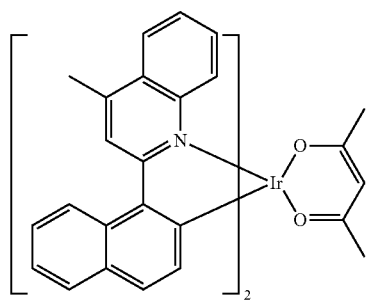
58
-continued
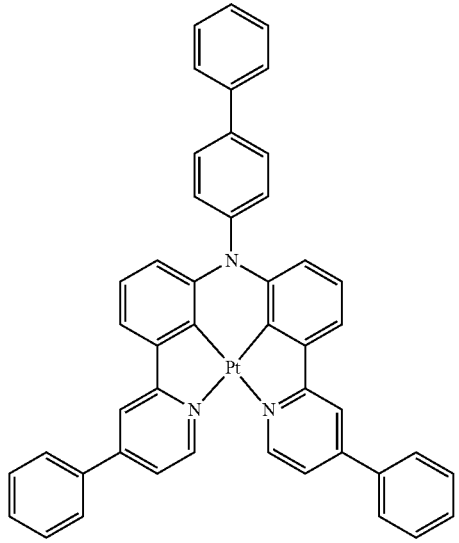
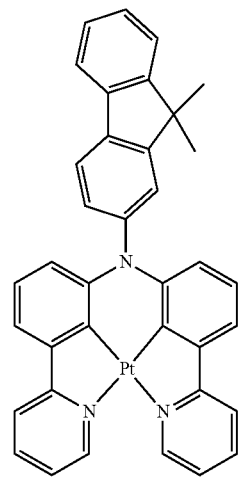
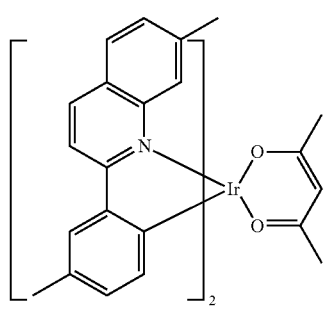

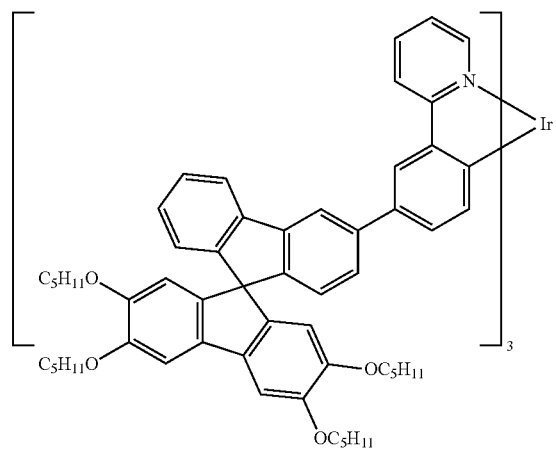
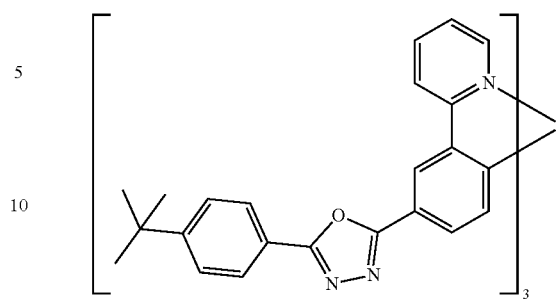
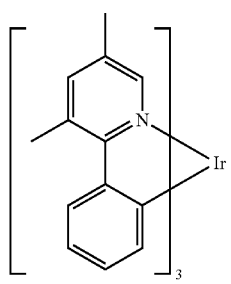
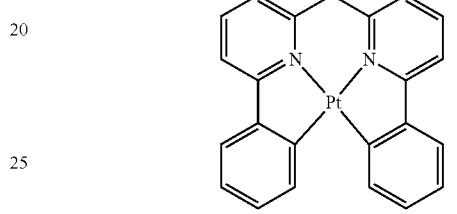
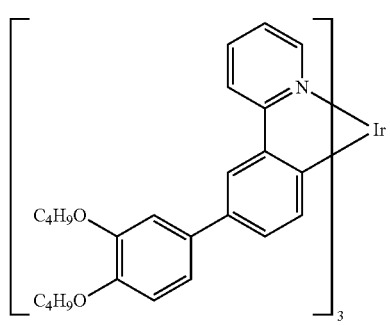
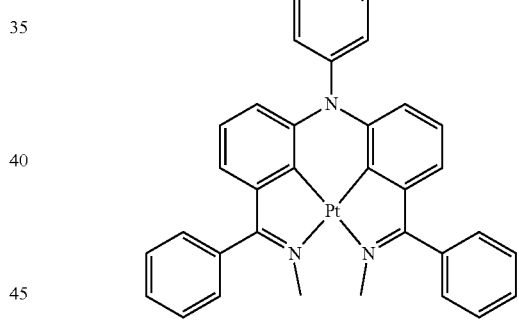
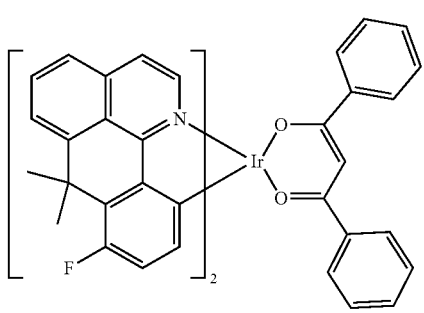
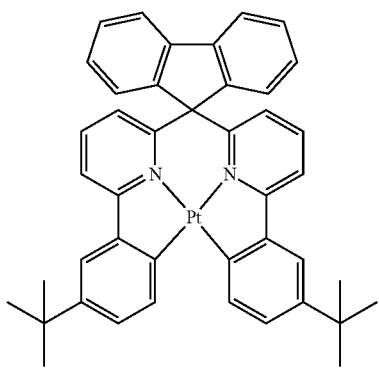

-continued

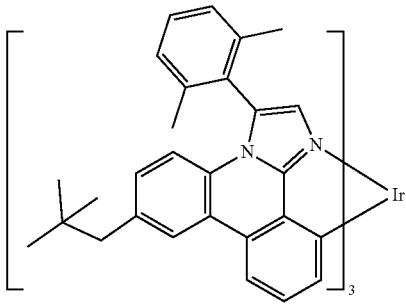

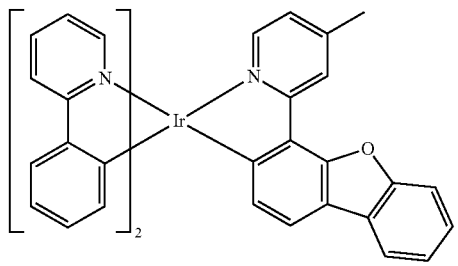

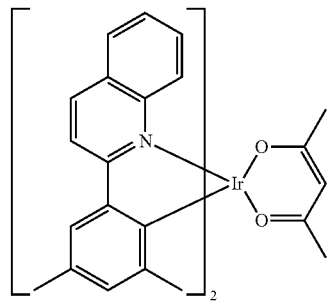

In another preferred embodiment, the functional material comprised in the formulation according to the present disclosure is a polymer material.

In general, the organic small-molecule functional materials described above, including HIM, HTM, ETM, EIM, Host, fluorescent emitters, phosphorescent emitters, and TADF, which may be comprised as a repeating unit in a polymer.

In a preferred embodiment, the polymer suitable for the present disclosure is a conjugated polymer. In general, the conjugated polymers have the following general formula:

Chemical Formula 1

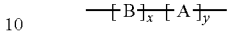

wherein B and A can be independently selected from the same or different structural units when present in multiple occurrences;

B: π-conjugated structural unit with a relatively large energy gap, also called a backbone unit, which may be selected from monocyclic or polycyclic aryl or heteroaryl groups. The preferred unit form is benzene, biphenylene, naphthalene, anthracene, phenanthrene, dihydrophenanthrene, 9,10-dihydrophenanthrene, fluorene, bifluorene, spirobifluorene, p-phenylacetylene, trans-indenofluorene, cis-indenofluorene, dibenzoindenofluorene, indenonaphthalene, and the derivatives thereof;

A: π-conjugated structural unit with a small energy gap, also called a functional unit, which may be selected from structural units comprising the hole injection or transport material (HIM/HTM), electron injection or transport material (EIM/ETM), host material, singlet emitter (fluorescent emitter), and heavy emitter (phosphor emitter) mentioned above according to different functional requirements; and x, y: >0, and x+y=1.

In some preferred embodiments, the functional material comprised in the printing formulation according to the present disclosure is a polymeric HTM.

In a preferred embodiment, the polymeric HTM material is a homopolymer, and preferred homopolymers are selected from the group consisting of polythiophenes, polypyrroles, polyanilines, polybiphenyl triarylamines, polyvinylcarbazoles, and derivatives thereof.

In another particularly preferred embodiment, the polymeric HTM material is a conjugated copolymer represented by Chemical Formula 1, wherein A: a functional group having hole transporting ability, which may be selected from the same or different structural units comprising the hole injection or transport material (HIM/HTM) described above; in a preferred embodiment, A is selected from the group consisting of amines, biphenyl triarylamines, thiophene, thiothiophenes such as dithienothiophene and thiothiophene, pyrrole, aniline, carbazole, indenocarbazole, indolizine-diphenyleneimide, pentacene, phthalocyanine, porphyrin and the derivative thereof; and x,y: >0, and x+y=1; usually y≥0.10, preferably ≥0.15, more preferably ≥0.20, and most preferably x=y=0.5.

Listed below are examples of suitable conjugated polymers that can be used as HTMs:

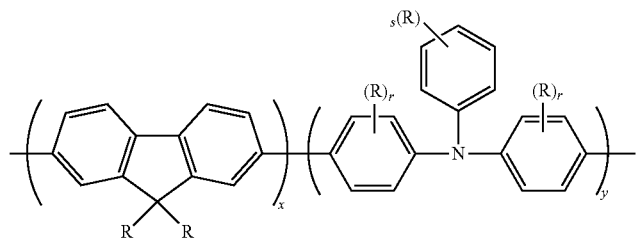

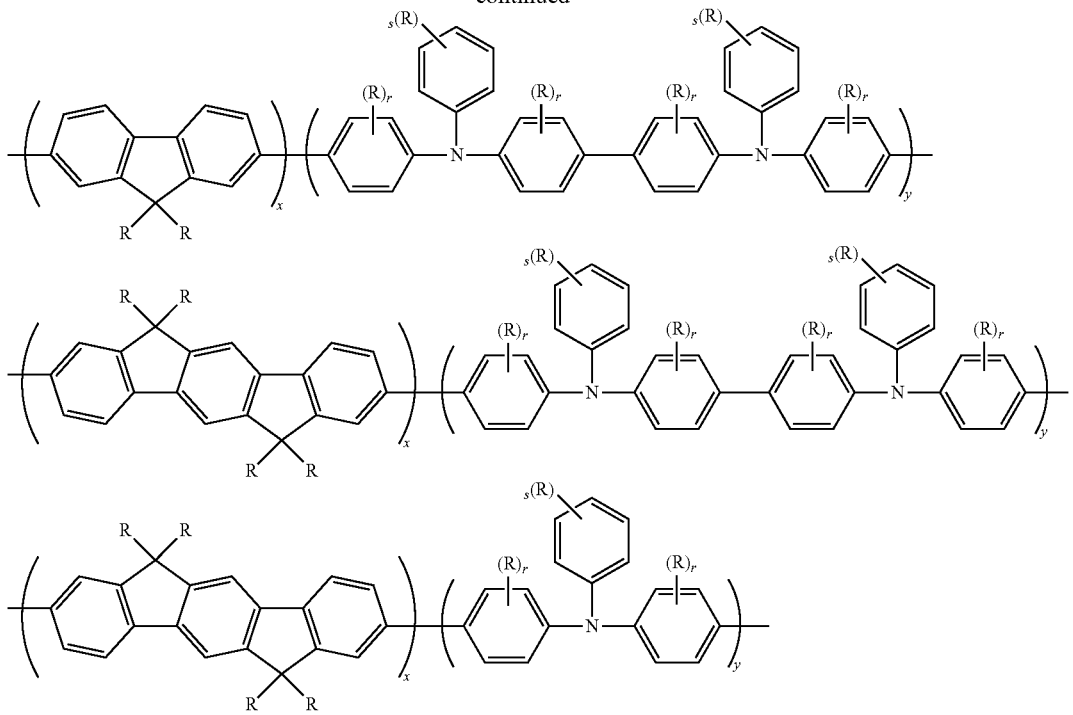

wherein,

R is each independently selected from a linear alkyl, alkoxy, or thioalkoxy having 1 to 20 C atoms; or a branched or cyclic alkyl, alkoxy or thioalkoxy group, or silyl group having 3 to 20 C atoms; or a substituted ketone group having 1 to 20 C atoms; or an alkoxy group having 2 to 20 C atoms; or an aryloxycarbonyl having 7 to 20 C atoms, cyano group (—CN), carbamoyl (—C(=O)NH$_2$), haloformyl (—C(=O)—X, wherein X represents a halogen atom), formyl (—C(=O)—H), isocyano, isocyanate, thiocyanate, or isothiocyanate, hydroxy, nitro, CF$_3$, Cl, Br, and F; a crosslinkable group or a substituted or unsubstituted aromatic or heteroaromatic ring system having 5 to 40 annular atoms; or an aryloxy group or heteroaryloxy group having 5 to 40 annular atoms, or a combination thereof, wherein one or more of the group R may form a monocyclic or polycyclic aliphatic or aromatic ring system with each other and/or with a ring bonded to said groups;

r is 0, 1, 2, 3 or 4;

s is 0, 1, 2, 3, 4 or 5; and x,y: >0, and x+y=1; usually y≥0.10, preferably y≥0.15, more preferably y≥0.20, and most preferably x=y=0.5.

Another preferred class of organic functional materials are polymers having electron transport capabilities, including conjugated polymers and non-conjugated polymers.

The preferred polymer ETM material is a homopolymer, with preferred homopolymers selected from the group consisting of polyphenanthrene, polyphenanthroline, polyindenofluorene, polyspirobifluorene, polyfluorene, and the derivatives thereof.

The preferred polymer ETM material is the conjugated copolymer represented by Chemical Formula 1, wherein A can be independently selected in the same or different forms in multiple occurrences:

A: a functional group with electron transport capability, preferably selected from tris(8-hydroxyquinoline) aluminum (AlQ$_3$), benzene, diphenylene, naphthalene, anthracene, phenanthrene, dihydrophenanthrene, fluorene, bifluorene, spirobifluorene, p-phenylene acetylene, pyrene, perylene, 9,10-dihydrophenanthrene, phenazine, phenanthroline, trans-indenofluorene, cis-indenofluorene, dibenzo-indenofluorene, indenaphthalene, benzopyrene and the derivatives thereof; and x,y: >0, and x+y=1; usually y≥0.10, preferably y≥0.15, more preferably y≥0.20, and most preferably x=y=0.5.

In another preferred embodiment, the functional material comprised in the printing formulation according to the present disclosure is a light-emitting polymer.

In a particularly preferred embodiment, the light-emitting polymer is a conjugated polymer having the following general formula:

Chemical Formula 2

B: having the same as the definition as in Chemical Formula 1;

A1: a functional group with hole or electron transport capability, which may be selected from structural units comprising the hole injection or transport material (HIM/HTM) or electron injection or transport material (EIM/ETM) described above;

A2: a group with a light-emitting function, which may be selected from structural units comprising singlet emitters (fluorescent emitters) and heavy emitters (phosphor emitters) as described above; and x,y,z: >0, and x+y+z=1.

Examples of light-emitting polymers are disclosed in the following patent applications: WO2007043495, WO2006118345, WO2006114364, WO2006062226, WO2006052457, WO2005104264, WO2005056633, WO2005033174, WO2004113412, WO2004041901, WO2003099901, WO2003051092, WO2003020790, WO2003020790, US2020040076853, US2020040002576, US2007208567, US2005962631, EP201345477, EP2001344788, DE102004020298, the entire contents of the above patent documents being incorporated herein by reference.

In another embodiment, the polymer suitable for the present disclosure is a non-conjugated polymer. It may be a polymer with a non-conjugated main chain and a side chain having all functional groups. Some of such non-conjugated polymers used as phosphorescent host or phosphorescent materials are disclosed in patent applications such as U.S. Pat. No. 7,250,226 B2, JP2007059939A, JP2007211243A2, and JP2007197574A2, and some such non-conjugated polymers used as fluorescent materials are disclosed in patent applications such as JP2005108556, JP2005285661 and JP2003338375. In addition, the non-conjugated polymer may also be a polymer with functional units on the main chain being linked by non-conjugated linking units. Examples of such polymers are disclosed in, for example, DE102009023154.4 and DE102009023156.0. The entire contents of the above patent documents are hereby incorporated by reference.

The present disclosure also relates to a method for preparing a film comprising a functional material by a printing or coating method, wherein any one of the above-mentioned printing formulation is coated on a substrate by a printing or coating method, wherein the coating method may be selected from (but not limited to) ink-jet printing, nozzle printing, typography, screen printing, dip coating, spin coating, blade coating, roll printing, torsion printing, lithography, flexography, rotary printing, spray printing, brush coating, pad printing, or slit type extrusion coating, and the like In a preferred embodiment, the film comprising the functional material is prepared by a method of ink jet printing. Inkjet printers that can be used to print with the inks in accordance with the present disclosure are commercially available printers and include drop-on-demand printheads. These printers are available from Fujifilm Dimatix (Lebanon, N.H.), Trident International (Brookfield, Conn.), Epson (Torrance, Calif.), Hitachi Data Systems Corporation (Santa Clara, Calif.), Xaar PLC (Cambridge, United Kingdom), and Idanit Technologies, Limited (Rishon Le Zion, Isreal). For example, the present invention can be printed using a Dimatix Materials Printer DMP-3000 (Fujifilm).

The present disclosure further relates to an electronic device comprising one or more functional films, wherein at least one functional film is produced using a printing formulation according to the present disclosure, in particular by printing or coating.

Suitable electronic devices include, but are not limited to, quantum dot light emitting diodes (QLEDs), quantum dot photovoltaic cells (QPVs), quantum dot light emitting electrochemical cells (QLEECs), quantum dot field effect transistors (QFETs), quantum dot light emitting field effect transistors, quantum dot lasers, quantum dot sensors, organic light emitting diodes (OLEDs), organic photovoltaic cells (OPVs), organic light emitting electrochemical cells (OLEECs), organic field effect transistors (OFETs), organic light emitting field effect transistors, organic lasers, organic sensors, and the like.

In a preferred embodiment, the electronic device described above is an electroluminescent device or a photovoltaic cell, as shown in FIG. 1, comprising a substrate (101), an anode (102), at least a light emitting layer or a light absorption layer (104), and a cathode (106). Now further illustration will be provided below using electroluminescent device only as an example.

The substrate (101) may be opaque or transparent. A transparent substrate can be used to make a transparent light emitting device. See, for example, Bulovic et al. Nature 1996, 380, p29, and Gu et al., Appl. Phys. Lett. 1996, 68, p2606. The substrate can be rigid or elastic. The substrate can be plastic, metal, semiconductor wafer or glass. Preferably the substrate has a smooth surface. Substrate-free substrate is a particularly good choice. In a preferred embodiment, the substrate may be selected from a polymer or plastic film having a glass transition temperature $T_g$ of 150° C. or above, preferably the substrate may be selected from a polymer or plastic film having a glass transition temperature $T_g$ of 200° C. or above, more preferably the substrate may be selected from a polymer or plastic film having a glass transition temperature $T_g$ of 250° C. or above, and most preferably the substrate may be selected from a polymer or plastic film having a glass transition temperature $T_g$ of 300° C. or above. Examples of suitable substrates are poly(ethylene terephthalate) (PET) and polyethylene glycol (2,6-naphthalene) (PEN).

The anode (102) may include a conductive metal or metal oxide, or a conductive polymer. The anode can easily inject holes into the HIL or HTL or the light emitting layer. In one embodiment, the absolute value of the difference between the work function of the anode and the HOMO level or valence band level of the p-type semiconductor material as HIL or HTL is less than 0.5 eV, preferably less than 0.3 eV, and most preferably less than 0.2 eV. Examples of anode materials include, but are not limited to, Al, Cu, Au, Ag, Mg, Fe, Co, Ni, Mn, Pd, Pt, ITO, aluminum doped zinc oxide (AZO), and the like. Other suitable anode materials are known and can be readily selected by one of ordinary skill in the art. The anode material may be deposited using any suitable technique, such as a suitable physical vapor deposition method including radio frequency magnetron sputtering, vacuum thermal evaporation, e-beam, and the like.

In certain embodiments, the anode is patterned. Patterned ITO conductive substrates are commercially available and can be used to make devices according to the present disclosure.

The cathode (106) may include a conductive metal or metal oxide. The cathode can easily inject electrons into the EIL or ETL or directly into the light emitting layer. In one embodiment, the absolute value of the difference between the work function of the cathode and the LUMO level or the conduction band level of the n-type semiconductor material as EIL or ETL or HBL is less than 0.5 eV, preferably less than 0.3 eV, and most preferably less than 0.2 eV. In principle, all materials that can be used as cathodes for OLEDs are possible as cathode materials for the devices of the present disclosure. Examples of cathode materials include, but are not limited to, Al, Au, Ag, Ca, Ba, Mg, LiF/Al, MgAg alloys, $BaF_2$/Al, Cu, Fe, Co, Ni, Mn, Pd, Pt, ITO, and the like. The cathode material may be deposited using any suitable technique, such as a suitable physical vapor deposition method including radio frequency magnetron sputtering, vacuum thermal evaporation, e-beam, and the like.

The light emitting layer (104) contains at least one light emitting functional material, and its thickness may be between 2 nm and 200 nm. In a preferred embodiment, in the light emitting device according to the present disclosure, the light emitting layer is prepared by printing with the printing ink of the present disclosure, wherein the printing ink comprises at least one kind of the light emitting functional materials as described above, especially the quantum dots or organic functional materials.

In a preferred embodiment, the light-emitting device according to the present disclosure further comprises a hole injection layer (HIL) or hole transport layer (HTL) (103), which comprises the organic HTM or inorganic p-type material as described above. In a preferred embodiment, the HIL or HTL can be prepared by printing with the printing ink of the present disclosure, wherein the printing ink comprises a functional material having a hole transporting ability, particularly a quantum dot or an organic HTM material.

In another preferred embodiment, the light emitting device according to the present disclosure further comprises an electron injection layer (EIL) or electron transport layer (ETL) (105) that comprises an organic ETM or inorganic n-type material as described above. In certain embodiments, the EIL or ETL can be prepared by printing with a printing ink of the present disclosure, wherein the printing ink comprises a functional material having electron transport capabilities, particularly quantum dot or organic ETM materials.

The present disclosure also relates to the use of the light emitting device according to the present disclosure in various applications including, but not limited to, various display devices, backlights, illumination sources, and the like.

The present disclosure will be described below with reference to following preferred embodiments, but is not limited thereto. It should be understood that the scope of the present disclosure is defined by the appended claims. Those skilled in the art will appreciate that, guided by the concept of the present disclosure, various modifications can be made to the embodiments of the disclosure, without departing from the spirit and scope of the present disclosure as claimed.

EXAMPLES

Example 1: Preparation of Blue-Light Quantum Dots (CdZnS/ZnS)

0.0512 g of S and 2.4 mL ODE were weighed in a 25 mL single-mouth flask, heated to 80° C. in an oil bath to dissolve S for later use (referred to as Solution 1 hereinafter). 0.1280 g of S and 5 mL of OA were weighed in a 25 mL single-mouth flask heated to 90° C. in an oil bath to dissolve S for later use (referred to as Solution 2 hereinafter). 0.1028 g of CdO, 1.4680 g of zinc acetate, and 5.6 mL of OA were weighed in a 50 mL three-necked flask, which was then placed in a 150-mL heating mantle, had both openings stoppered with a rubber stopper, and was connected to a condensing tube at the top. The tube was then connected to a double-barreled tube. The mixture was heated to 150° C., vacuumed for 40 minutes, and then purged with nitrogen. A syringe was used to add 12 mL of ODE to the three-necked flask, which was heated to a temperature of 310° C., when 1.92 mL of Solution 1 was rapidly injected into the three-necked flask with a syringe and timed for 12 min. After 12 minutes, 4 mL of Solution 2 was added dropwise to the three-necked flask with a syringe at about 0.5 mL/min. The reaction went on for 3 h and then stopped. The three-necked flask was immediately put into water and cooled to 150° C.

An excessive amount of n-hexane was added to the three-necked flask, then the liquid in the three-necked flask was transferred to a plurality of 10 mL centrifuge tubes, centrifuged to remove the lower precipitate and repeated three times. The post-treated liquid was added with acetone until precipitation, centrifuged to remove the supernatant, with a precipitate remaining. The precipitate was then dissolved with n-hexane, added with acetone to precipitate, and centrifuges to remove the supernatant, leaving a precipitate behind. These steps were repeated for three times. Finally, the precipitate was dissolved in toluene and transferred to a glass bottle for storage.

Example 2: Preparation of Green Light Quantum Dots (CdZnSeS/ZnS)

0.0079 g of selenium and 0.1122 g of sulphur were weighed in a 25 mL single-mouth flask, added with 2 mL of TOP, purged with nitrogen, and stirred for later use (referred to as Solution 1 hereinafter). 0.0128 g of CdO, 0.3670 g of zinc acetate, and 2.5 mL of OA were weighed in a 25 mL three-necked flask, which then had both openings stoppered with a rubber stopper, and was connected to a condensing tube at the top. The tube was then connected to a double-barreled tube. The three-neck flask was placed in a 50 mL heating mantle, vacuumed, purged with nitrogen, heated to 150° C., vacuumed for 30 minutes, injected with 7.5 mL of ODE, heated to 300° C., rapidly injected with 1 mL of Solution 1, and timed for 10 min. After 10 minutes, the reaction was stopped immediately. The three-necked flask was put into water for cooling.

To the three-necked flask was added 5 mL of n-hexane, and then the mixture was added to a plurality of 10 mL centrifuge tubes, added with acetone until precipitation, and centrifuged. The precipitate was taken, and the supernatant was removed. The precipitate was dissolved with n-hexane, added with acetone until a precipitate was formed, and centrifuged. These steps were repeated for three times. The final precipitate was dissolved with a small amount of toluene and transferred to a glass bottle for storage.

Example 3: Preparation of Red Light Quantum Dots (CdSe/CdS/ZnS)

1 mmol of CdO, 4 mmol of OA and 20 ml of ODE were added to a 100 ml three-necked flask, Purged with nitrogen, heated to 300° C. to form a $Cd(OA)_2$ precursor. At this temperature, 0.25 mL of TOP with 0.25 mmol Se dissolved was rapidly injected. The reaction solution was allowed to react at this temperature for 90 seconds, and a CdSe core of about 3.5 nm was grown. 0.75 mmol of octanethiol was added dropwise to the reaction solution at 300° C. After about 30 minutes of reaction, a CdS shell about 1 nm thick was grown. 4 mmol of $Zn(OA)_2$ and 2 ml of TBP dissolved with 4 mmol of S powder were then added dropwise to the reaction solution to grow a ZnS shell (about 1 nm). The reaction was continued for 10 minutes and cooled to room temperature.

To the three-necked flask was added 5 mL of n-hexane, and then the mixture was added to a plurality of 10 mL centrifuge tubes, added with acetone until precipitation, and centrifuged. The precipitate was taken, and the supernatant was removed. The precipitate was dissolved with n-hexane, added with acetone until a precipitate was formed, and centrifuged. These steps were repeated for three times. The final precipitate was dissolved with a small amount of toluene and transferred to a glass bottle for storage.

Example 4: Preparation of ZnO Nanoparticles 1.475 g of zinc acetate was dissolved in 62.5 mL of methanol to obtain Solution 1. 0.74 g KOH was dissolved in 32.5 mL of methanol to give solution 2. Solution 1 was heated to 60° C. and stirred vigorously. Solution 2 was added dropwise to solution 1 using a sample injector. After the addition was completed, the mixed solution system was further stirred at 60° C. for 2 hours. The heating source was removed and the solution was allowed to stand for 2 hours. The reaction solution was centrifuged at 4,500 rpm, 5 min and washed for three times or more. The final ZnO nanoparticles were yielded as white solid with a diameter of about 3 nm.

The boiling point, the surface tension, and viscosity parameters of the examples of some solvents used in the present disclosure are listed in the following table:

| name | structural formula | boiling point (° C.) | surface tension @RT (dyne/cm) | viscosity @RT (cPs) |
|---|---|---|---|---|
| tributyl borate | $C_4H_9$—O—B(—O—$C_4H_9$)—O—$C_4H_9$ | 234 | 24.5 | 1.2 |
| triamyl borate | $C_5H_{11}$—O—B(—O—$C_5H_{11}$)—O—$C_5H_{11}$ | 275 | 27.3 | 2.88 |
| triethyl phosphate | $C_2H_5$—O—P(=O)(—O—$C_2H_5$)—O—$C_2H_5$ | 215 | 30.2 | 1.6 |
| triphenyl phosphate | (PhO)$_3$P=O | 245 | 40.6 | 11 |

Example 5: Preparation of Quantum Dot Printing Inks Comprising Triamyl Borate A stirrer was placed in a vial, cleaned and transferred to a glove box. In the vial, 9.5 g of a solvent of triamyl borate was prepared. The quantum dots were precipitated from the solution with acetone and centrifuged to obtain the quantum dot solids. 0.5 g of quantum dot solids were weighed in the glove box, added to the solvent system in the vial and mixed by stirring. The quantum dots were stirred at 60° C. until completely dispersed and cooled to room temperature. The resulting quantum dot solution was filtered through a 0.2 μm PTFE filter, sealed for storage.

Example 6: Preparation of Quantum Dot Printing Inks Comprising Triphenyl Phosphate and Triethyl Phosphate A stirrer was placed in a vial, cleaned and transferred to a glove box. In the vial, 9.5 g of a mixed solvent of triphenyl phosphate and triethyl phosphate (weight ratio: 40:60) was prepared. The quantum dots were precipitated from the solution with acetone and centrifuged to obtain the quantum dot solids. 0.5 g of quantum dot solids were weighed in the glove box, added to the solvent system in the vial and mixed by stirring. The quantum dots were stirred at 60° C. until completely dispersed and cooled to room temperature. The resulting quantum dot solution was filtered through a 0.2 μm PTFE filter, sealed for storage.

Example 7: Preparation of ZnO Nanoparticle Printing Inks Comprising Triethyl Phosphate A stirrer was placed in a vial, cleaned and transferred to a glove box. In the vial, 9.5 g of a solvent of triethyl phosphate was prepared. 0.5 g of ZnO quantum dot solids were weighed in the glove box, added to the solvent system in the vial and mixed by stirring. The ZnO quantum dots were stirred at 60° C. until completely dispersed and cooled to room temperature. The resulting ZnO quantum dot solution was filtered through a 0.2 μm PTFE filter, sealed for storage.

Example 8: Preparation of ZnO Nanoparticle Printing Inks Comprising Triphenyl Phosphate and Triamyl Borate A stirrer was placed in a vial, cleaned and transferred to a glove box. In the vial, 9.5 g of a mixed solvent of triphenyl phosphate and triamyl borate (weight ratio: 40:60) was prepared. 0.5 g of ZnO quantum dot solids were weighed in the glove box, added to the solvent system in the vial and mixed by stirring. The ZnO quantum dots were stirred at 60° C. until completely dispersed and cooled to room temperature. The resulting ZnO quantum dot solution was filtered through a 0.2 μm PTFE filter, sealed for storage.

The organic functional materials involved in the following examples are all commercially available, such as from Jilin OLED Material Tech Co., Ltd, www.jl-oled.com, or can be synthesized according to a method reported in the literature.

Example 9: Preparation of Organic Light-Emitting Layer Material Printing Ink Comprising Triphenyl Phosphate and Triamyl Borate In this embodiment, the organic functional material for the light-emitting layer comprises a phosphorescent host material and a phosphorescent emitter material. The phosphorescent host material is selected from the following carbazole derivatives:

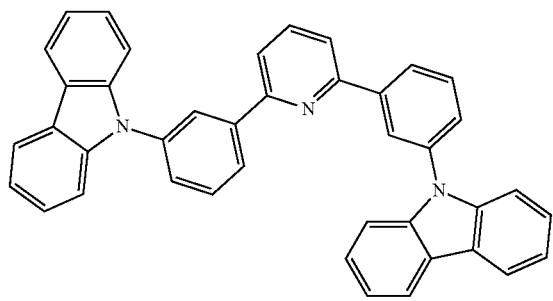 [SMILES: c1cc(-c2cccc(-c3cccc(-n4c5ccccc5c5ccccc54)c3)n2)cc(-n2c3ccccc3c3ccccc32)c1]

The phosphorescent emitter material is selected from the following iridium complexes:

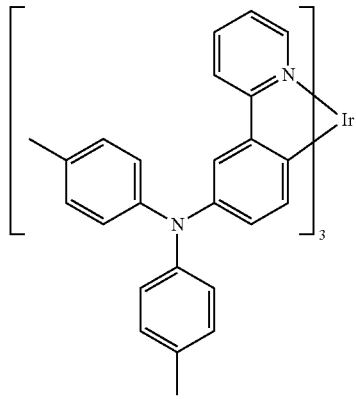

A stirrer was placed in a vial, cleaned and transferred to a glove box. In the vial, 9.8 g of a mixed solvent of triphenyl phosphate and triamyl borate (weight ratio: 40:60) was prepared. 0.18 g of a phosphorescent host material and 0.02 g of a phosphorescent emitter material were weighed in the glove box, added to the solvent system in the vial and mixed by stirring. The organic functional material was stirred at 60° C. until completely dispersed and cooled to room temperature. The resulting organic functional material solution was filtered through a 0.2 μm PTFE filter, sealed for storage.

Example 10: Preparation of an Organic Light-Emitting Layer Material Printing Ink Comprising Triphenyl Phosphate and Triethyl Phosphate In this embodiment, the organic functional material for light-emitting layer comprises a fluorescent host material and a fluorescent emitter material.

The fluorescent host material is selected from the following spirofluorene derivatives:

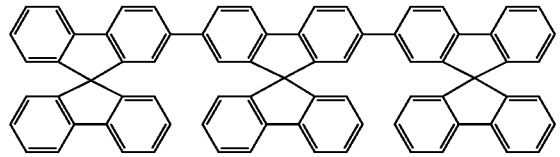 [SMILES: c1ccc2c(c1)-c1ccccc1C21c2ccccc2-c2ccc(-c3ccc4c(c3)C3(c5ccccc5-c5ccccc53)c3cc(-c5ccc6c(c5)C5(c7ccccc7-c7ccccc75)c5ccccc5-6)ccc3-4)cc21]

The fluorescent emitter material is selected from the following compounds:

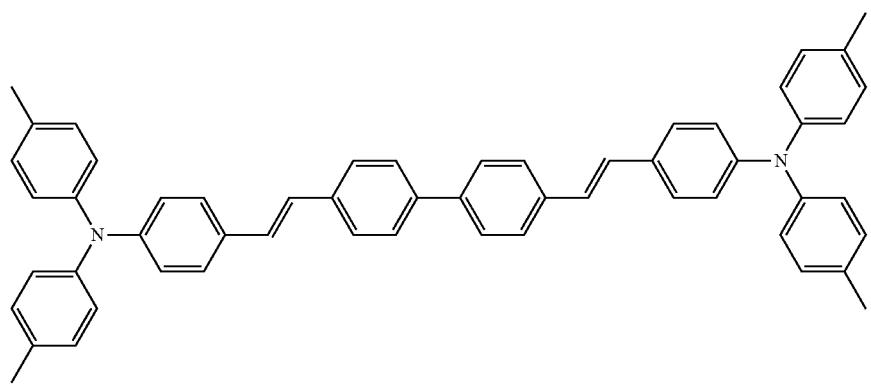

A stirrer was placed in a vial, cleaned and transferred to a glove box. In the vial, 9.8 g of a mixed solvent of triphenyl phosphate and triethyl phosphate (weight ratio: 40:60) was prepared. 0.19 g of a fluorescent host material and 0.01 g of a fluorescent emitter material were weighed in the glove box, added to the solvent system in the vial and mixed by stirring. The organic functional material were stirred at 60° C. until completely dispersed and cooled to room temperature. The resulting organic functional material solution was filtered through a 0.2 μm PTFE filter, sealed for storage.

Example 11: Preparation of an Organic Light-Emitting Layer Material Printing Ink Comprising Triphenyl Phosphate and Triethyl Phosphate In this embodiment, the organic functional material for light-emitting layer comprises a host material and a TADF material.

The host material is selected from the following compounds:

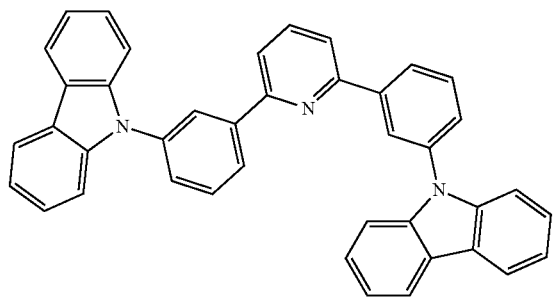 [SMILES: c1cc(-c2cccc(-c3cccc(-n4c5ccccc5c5ccccc54)c3)n2)cc(-n2c3ccccc3c3ccccc32)c1]

The TADF material is selected from the following structures:

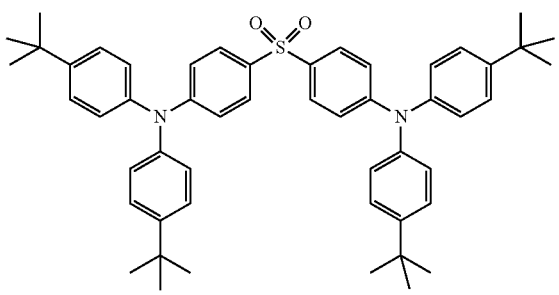 [SMILES: CC(C)(C)c1ccc(N(c2ccc(C(C)(C)C)cc2)c2ccc(S(=O)(=O)c3ccc(N(c4ccc(C(C)(C)C)cc4)c4ccc(C(C)(C)C)cc4)cc3)cc2)cc1]

A stirrer was placed in a vial, cleaned and transferred to a glove box. In the vial, 9.8 g of a mixed solvent of triphenyl phosphate and triethyl phosphate (weight ratio: 40:60) was prepared. 0.19 g of a fluorescent host material and 0.01 g of TADF material were weighed in the glove box, added to the solvent system in the vial and mixed by stirring. The organic functional material were stirred at 60° C. until completely dispersed and cooled to room temperature. The resulting organic functional material solution was filtered through a 0.2 μm PTFE filter, sealed for storage.

Example 12: Preparation of a Hole Transport Material Printing Ink Comprising Triphenyl Phosphate and Tributyl Borate In this embodiment, the printing ink comprises a hole transport layer material having hole transport capability.

The hole transport material is selected from the following triarylamine derivatives:

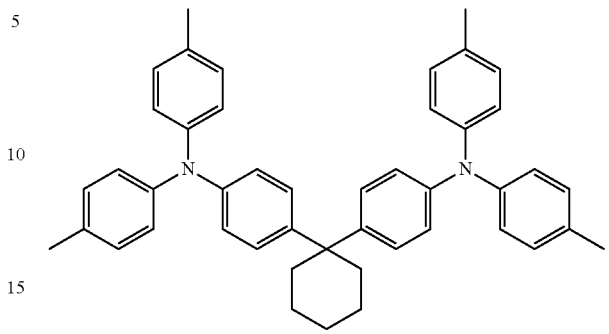

A stirrer was placed in a vial, cleaned and transferred to a glove box. In the vial, 9.8 g of a mixed solvent of triphenyl phosphate and tributyl borate (weight ratio: 40:60) was prepared. 0.2 g of the hole transport material were weighed in the glove box, added to the solvent system in the vial and mixed by stirring. The organic functional material was stirred at 60° C. until completely dispersed and cooled to room temperature. The resulting organic functional material solution was filtered through a 0.2 μm PTFE filter, sealed for storage.

Example 13: Test of Viscosity and Surface Tension

The viscosity of the functional material ink was tested by a DV-I Prime Brookfield rheometer; and the surface tension of the functional material ink was tested by a SITA bubble pressure tensiometer.

In the above test, the functional material ink obtained in Example 5 had a viscosity of 3.8±0.5 cPs and a surface tension of 26.9±0.5 dyne/cm.

In the above test, the functional material ink obtained in Example 6 had a viscosity of 4.7±0.5 cPs and a surface tension of 33.6±0.3 dyne/cm.

In the above test, the functional material ink obtained in Example 7 had a viscosity of 2.9±0.5 cPs and a surface tension of 29.5±0.5 dyne/cm.

In the above test, the functional material ink obtained in Example 8 had a viscosity of 6.3±0.5 cPs and a surface tension of 32.3±0.3 dyne/cm.

In the above test, the functional material ink obtained in Example 9 had a viscosity of 6.1±0.5 cPs and a surface tension of 32.7±0.5 dyne/cm.

In the above test, the functional material ink obtained in Example 10 had a viscosity of 4.9±0.5 cPs and a surface tension of 32.4±0.3 dyne/cm.

In the above test, the functional material ink obtained in Example 11 had a viscosity of 5.1±0.5 cPs and a surface tension of 32.6±0.5 dyne/cm.

In the above test, the functional material ink obtained in Example 12 had a viscosity of 4.4±0.5 cPs and a surface tension of 28.4±0.5 dyne/cm.

By using the above-prepared printing ink comprising functional materials based on inorganic ester solvent system, a functional layer in a light emitting diode, such as a light emitting layer and a charge transport layer, can be prepared by ink jet printing. The specific steps are as follows.

The ink comprising the functional material was loaded into an ink tank that is fitted to an inkjet printer such as Dimatix Materials Printer DMP-3000 (Fujifilm). By adjusting the waveform, pulse time, and voltage of the ejected ink, the ink ejection is optimized, and the ink ejection range is stabilized. In the preparation of OLED/QLED devices where the functional material film is a light-emitting layer, the following technical solution is adopted. The substrate of the OLED/QLED is a 0.7 mm-thick glass sputtered with an indium tin oxide (ITO) electrode pattern. The pixel defining layer is patterned on ITO to form holes for depositing printing ink inside. The HIL/HTL material was then ink jet printed into the well and dried under vacuum and elevated temperature to remove the solvent and yield a HIL/HTL film. Thereafter, a printing ink comprising a light-emitting functional material was inkjet printed on the HIL/HTL film, and the solvent was removed under vacuum and elevated temperature to obtain a film of light-emitting layer. Then, the printing ink comprising a functional material with an electron-transporting property was ink-jet printed onto the light-emitting layer film, and the solvent was removed by drying under vacuum and elevated temperature to form an electron transport layer (ETL). When using organic electron transport materials, ETL can also be formed by vacuum thermal evaporation. The Al cathode is then formed by vacuum deposition and finally packaged to complete the preparation of an OLED/QLED device.

The invention claimed is:

1. A printing formulation comprises at least one functional material and at least one inorganic ester solvent having the following general formula:

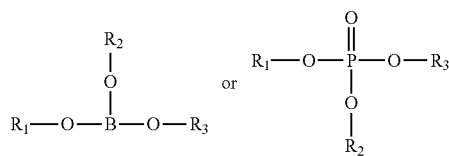

wherein, $R^1, R^2, R^3$ are each independently selected from the group consisting of H; D; a linear alkyl, alkoxy group, or thioalkoxy group having 1 to 20 carbon atoms; a branched or cyclic alkyl, alkoxy group or thioalkoxy group, or silyl group having 3 to 20 carbon atoms; a substituted ketone group having 1 to 20 carbon atoms; an alkoxycarbonyl group having 2 to 20 carbon atoms; an aryloxycarbonyl having 7 to 20 carbon atoms; cyano group, carbamoyl, haloformyl, formyl, isocyano group, isocyanate group, thiocyanate group, or isothiocyanate, hydroxy, nitro, $CF_3$, Cl, Br, and F; a substituted or unsubstituted aromatic or heteroaromatic ring group having 5 to 40 annular atoms; or an aryloxy group or heteroaryloxy group having 5 to 40 annular atoms, or a combination thereof, wherein the inorganic ester solvent has a boiling point greater than or equal to 150° C., and can be evaporated from a solvent system to form a functional material film, wherein the functional material is a quantum dot material.

2. The printing formulation according to claim 1, wherein the inorganic ester solvent has a viscosity ranging from 1 cPs to 100 cPs at 25° C.

3. The printing formulation according to claim 1, wherein the inorganic ester solvent has a surface tension ranging from 19 dyne/cm to 50 dyne/cm at 25° C.

4. The printing formulation according to claim 1, wherein the inorganic ester solvent is selected from the group consisting of alkyl borate or alkyl phosphate.

5. The printing formulation according to claim 1, wherein the inorganic ester solvent is selected from tributyl borate, triamyl borate, trimethyl phosphate, triethyl phosphate, tributyl phosphate, tri(2-ethylhexyl) phosphate, triphenyl phosphate, diethyl phosphate, dibutyl phosphate, di(2-ethylhexyl) phosphate, or a combination thereof.

6. The printing formulation according to claim 1, wherein the printing formulation further includes at least one other solvent, and the inorganic ester solvent accounts for more than 50% of the total weight of the mixed solvent.

7. The printing formulation according to claim 1, wherein the functional material is an inorganic nano-material.

8. The printing formulation according to claim 1, wherein the quantum dot material has a particle size having a monodisperse size distribution and a shape selected from spheres, cubes, rods, or branched structures.

9. The printing formulation according to claim 1, wherein the quantum dot material is a light-emitting quantum dot material, which has an emission wavelength between 380 nm and 2500 nm.

10. The printing formulation according to claim 1, wherein the printing formulation further includes an inorganic functional material selected from a binary semiconductor compound or a multinary semiconductor compound of Group IV, II-VI, II-V, III-V, IV-VI, II-IV-VI, and II-IV-V of the periodic table, or a mixture thereof.

11. The printing formulation according to claim 1, wherein the printing composition comprises the functional material in a weight ratio in the range of 0.3% to 30%, and the inorganic ester solvent is in a weight ratio from 70% to 99.7%.

12. An electronic device comprising a functional layer, wherein said functional layer is prepared by printing or coating with the printing formulation according to claim 1, and the inorganic ester solvent can be evaporated from the solvent system to form a functional material film.

13. The electronic device according to claim 12, wherein the electronic device is selected from quantum dot light emitting diodes, quantum dot photovoltaic cells, quantum dot light emitting electrochemical cells, quantum dot field effect transistors, quantum dot light emitting field effect transistors, quantum dot lasers, quantum dot sensors, organic light-emitting diodes, organic photovoltaic cells, organic light-emitting electrochemical cells, organic field effect transistors, organic light-emitting field effect transistors, organic lasers, or organic sensors.

14. A method for preparing a functional material film, wherein the printing formulation according to claim 1 is coated on a substrate by a printing or coating method, wherein the printing or coating method is selected from ink-jet printing, nozzle printing, typography, screen printing, dip coating, spin coating, blade coating, roll printing, torsion printing, lithography, flexography, rotary printing, spray printing, brush coating, pad printing, or slit type extrusion coating.

* * * * *